United States Patent
Iwakaji et al.

(10) Patent No.: US 11,282,949 B2
(45) Date of Patent: Mar. 22, 2022

(54) SEMICONDUCTOR DEVICE AND SEMICONDUCTOR CIRCUIT

(71) Applicants: Kabushiki Kaisha Toshiba, Tokyo (JP); Toshiba Electronic Devices & Storage Corporation, Tokyo (JP)

(72) Inventors: Yoko Iwakaji, Tokyo (JP); Tomoko Matsudai, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/989,101

(22) Filed: Aug. 10, 2020

(65) Prior Publication Data

US 2021/0296475 A1 Sep. 23, 2021

(30) Foreign Application Priority Data

Mar. 19, 2020 (JP) .............................. JP2020-050273

(51) Int. Cl.
*H01L 29/739* (2006.01)
*H01L 29/40* (2006.01)
*H01L 29/10* (2006.01)

(52) U.S. Cl.
CPC ...... *H01L 29/7397* (2013.01); *H01L 29/1095* (2013.01); *H01L 29/407* (2013.01)

(58) Field of Classification Search
None
See application file for complete search history.

(56) References Cited

U.S. PATENT DOCUMENTS

| 5,329,142 A | 7/1994 | Kitagawa et al. |
| 6,040,599 A | 3/2000 | Takahashi |
| 7,675,113 B2 | 3/2010 | Sakamoto et al. |
| 2005/0161768 A1 | 7/2005 | Sugiyama et al. |
| 2014/0209972 A1 | 7/2014 | Sumitomo et al. |

(Continued)

FOREIGN PATENT DOCUMENTS

| JP | 2000-101076 A | 4/2000 |
| JP | 2002-016252 A | 1/2002 |
| JP | 3288218 B2 | 6/2002 |

(Continued)

*Primary Examiner* — Hsien Ming Lee
(74) *Attorney, Agent, or Firm* — Allen & Overy LLP

(57) ABSTRACT

A semiconductor device of one embodiment including: a semiconductor layer with first and second planes, first and second trenches, a third trench beside the first trench, a fourth trench beside the second trench, and first to fourth semiconductor regions; first to fourth gate electrodes in the first to fourth trenches, respectively; a first electrode on the first plane, a first contact area with the semiconductor layer between the first trench and the third trench being larger than a second contact area with the semiconductor layer between the third trench and the fourth trench, a third contact area with the semiconductor layer between the second trench and the fourth trench being larger than the second contact area; a second electrode on the second plane; a first gate electrode pad connected to the first and second gate electrodes; and a second gate electrode pad connected to the third and fourth gate electrodes.

15 Claims, 11 Drawing Sheets

(56) References Cited

U.S. PATENT DOCUMENTS

2020/0091326 A1* 3/2020 Iwakaji ............... H01L 29/0623

FOREIGN PATENT DOCUMENTS

| JP | 3617938 B2 | 2/2005 |
|----|---|---|
| JP | 2008-227251 A | 9/2008 |
| JP | 4398719 B2 | 1/2010 |
| JP | 2012-099696 A | 5/2012 |
| JP | 5014646 B2 | 8/2012 |
| JP | 5742672 B2 | 7/2015 |
| JP | 2020-047790 A | 3/2020 |

* cited by examiner

SEMICONDUCTOR DEVICE AND SEMICONDUCTOR CIRCUIT

CROSS-REFERENCE TO RELATED APPLICATION

This application is based upon and claims the benefit of priority from Japanese Patent Application No. 2020-050273, filed on Mar. 19, 2020, the entire contents of which are incorporated herein by reference.

FIELD

Embodiments described herein relate generally to a semiconductor device and a semiconductor circuit.

BACKGROUND

As an example of a semiconductor device for high power, there is an insulated gate bipolar transistor (IGBT). In the IGBT, for example, a p-type collector region, an n-type drift region, and a p-type base region are provided on a collector electrode. Then, a gate electrode is provided in the trench penetrating the p-type base region and reaching the n-type drift region with the gate insulating film interposed therebetween. Furthermore, an n-type emitter region connected to an emitter electrode is provided in a region adjacent to the trench on the frontside of the p-type base region.

In the IGBT, a channel is formed in the p-type base region by applying a positive voltage equal to or higher than a threshold voltage to the gate electrode. Then, electrons are injected from the n-type emitter region to the n-type drift region, and at the same time, holes are injected from the collector region to the n-type drift region. Accordingly, a current having electrons and holes as carriers flows between the collector electrode and the emitter electrode.

In order to reduce the on-resistance of the IGBT, it is effective to increase the carrier concentration of the n-type drift region in the on state. On the other hand, when the discharge of carriers from the n-type drift region is delayed at the time of the turn-off of the IGBT, the turn-off time becomes long, and switching loss is increased.

Double gate driving has been proposed as a method for achieving both the reduction of the on-resistance and the reduction of switching loss. The double gate driving is a technique for reducing the switching loss by shortening the switching time of the IGBT by setting the gate driving system to two systems and changing the drive timing of two gates individually. Therefore, it is possible to achieve both the reduction of the on-resistance and the reduction of the switching loss.

DETAILED DESCRIPTION

Figure 1:
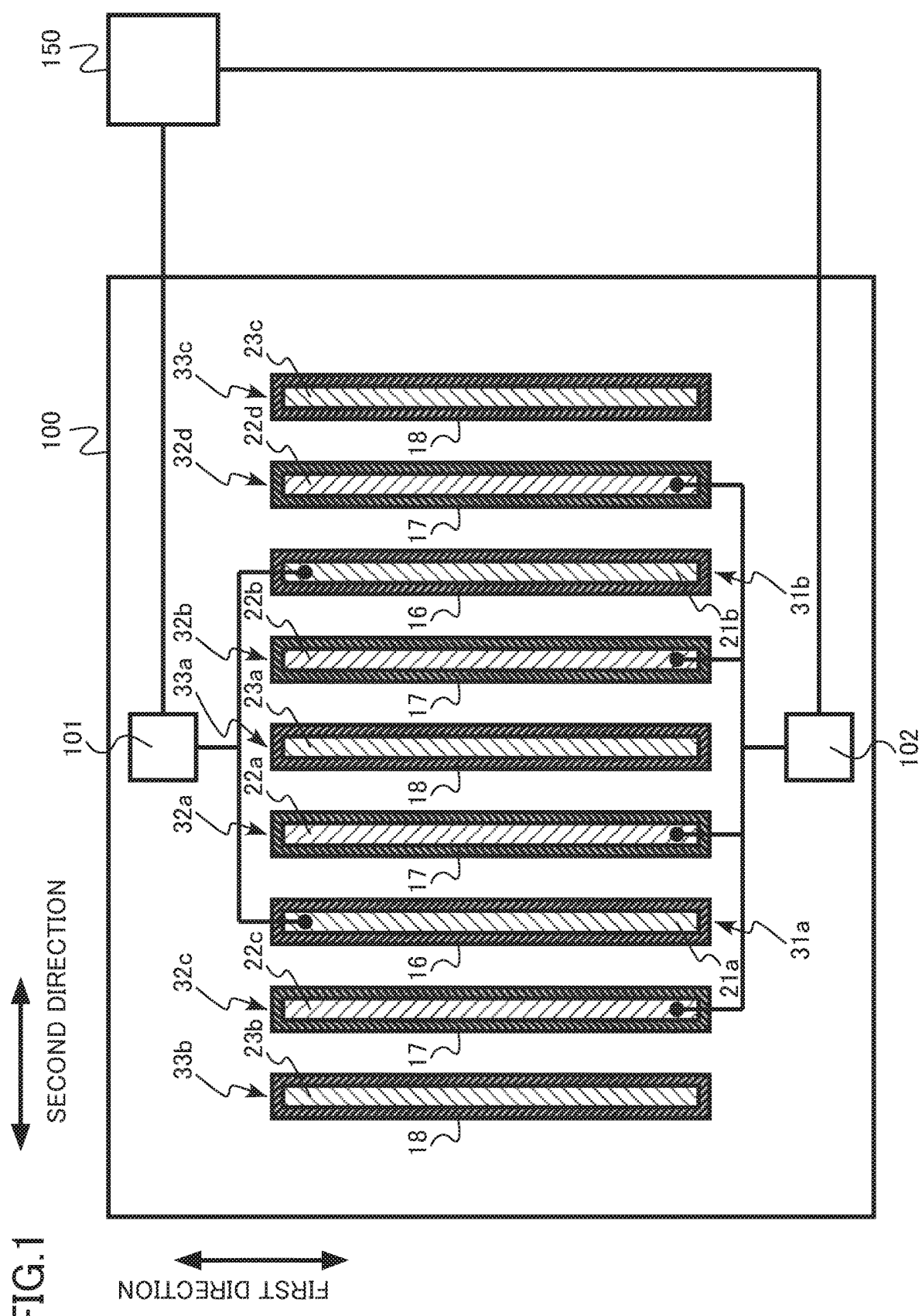
FIG. 1 is a schematic diagram of a semiconductor circuit according to a first embodiment.

A semiconductor device according to an embodiment includes: a semiconductor layer including a first plane and a second plane facing the first plane, the semiconductor layer including: a first trench provided on a side of the first plane and extending in a first direction parallel to the first plane; a second trench provided on the side of the first plane and extending in the first direction; a third trench provided between the first trench and the second trench on the side of the first plane, being adjacent to the first trench, and extending in the first direction; a fourth trench provided between the third trench and the second trench on the side of the first plane, being adjacent to the second trench, and extending in the first direction; a first semiconductor region of a first conductivity type; a second semiconductor region of a second conductivity type provided between the first semiconductor region and the first plane; a third semiconductor region of the first conductivity type provided between the second semiconductor region and the first plane; a fourth semiconductor region of the second conductivity type provided between the third semiconductor region and the first plane, being in contact with the first trench, being separated from the third trench, and having a second conductivity type impurity concentration higher than a second conductivity type impurity concentration of the second semiconductor region; and a fifth semiconductor region of the second conductivity type provided between the third semiconductor region and the first plane, being in contact with the second trench, being separated from the fourth trench, and having a second conductivity type impurity concentration higher than a second conductivity type impurity concentration of the second semiconductor region; a first gate electrode provided in the first trench; a second gate electrode provided in the second trench; a third gate electrode provided in the third trench; a fourth gate electrode provided in the fourth trench; a first electrode provided on the side of the first plane of the semiconductor layer and being electrically connected to the fourth semiconductor region and the fifth semiconductor region, a first contact area being an area of a region where the first electrode contacting with the semiconductor layer between the first trench and the third trench, a second contact area being an area of a region where the first electrode contacting with the semiconductor layer between the third trench and the fourth trench, a third contact area being an area of a region where the first electrode contacting with the semiconductor layer between the second trench and the fourth trench, the first contact area being larger than the second contact area, and the third contact area being larger than the second contact area; a second electrode provided on a side of the second plane of the semiconductor layer and being electrically connected to the first semiconductor region; a first gate electrode pad provided on the side of the first plane of the semiconductor layer, being electrically connected to the first gate electrode and the second gate electrode, and being applied with a first gate voltage; and a second gate electrode pad provided on the side of the first plane of the semiconductor layer, being electrically connected to the third gate electrode and the fourth gate electrode, and being applied with a second gate voltage.

Hereinafter, embodiments will be described with reference to the drawings. In the following description, the same or similar members and the like will be denoted by the same reference numerals, and the description of the members and the like once described will be appropriately omitted.

In this specification, notations of $n^+$-type, n-type, and $n^-$-type denote that the impurity concentration of the n-type is lowered in the order of $n^+$-type, n-type, and $n^-$-type. In addition, notations of $p^+$-type, p-type, and $p^-$-type denote that the impurity concentration of the p-type is lowered in the order of $p^+$-type, p-type, and p-type.

In this specification, the distribution and absolute values of the impurity concentrations in the semiconductor regions can be measured by using, for example, secondary ion mass spectrometry (SIMS). In addition, the relative magnitude relationship between the impurity concentrations of the two semiconductor regions can be determined by using, for example, scanning capacitance microscopy (SCM). The distribution and absolute values of the impurity concentrations can be measured by using, for example, a spreading resistance analysis (SRA) method. In the SCM and the SRA, the relative magnitude relationship and the absolute values of the carrier concentrations in the semiconductor regions can be obtained. By assuming the activation rate of the impurities, the relative magnitude relationship between the impurity concentrations of two semiconductor regions, the distribution of the impurity concentrations, and the absolute values of the impurity concentrations can be obtained from the measurement results of the SCM and the SRA.

First Embodiment

A semiconductor device according to a first embodiment includes a semiconductor layer including a first plane and a second plane facing the first plane, the semiconductor layer including: a first trench provided on a side of the first plane and extending in a first direction parallel to the first plane; a second trench provided on the side of the first plane and extending in the first direction; a third trench provided between the first trench and the second trench on the side of the first plane, being adjacent to the first trench, and extending in the first direction; a fourth trench provided between the third trench and the second trench on the side of the first plane, being adjacent to the second trench, and extending in the first direction; a first semiconductor region of a first conductivity type; a second semiconductor region of a second conductivity type provided between the first semiconductor region and the first plane; a third semiconductor region of the first conductivity type provided between the second semiconductor region and the first plane; a fourth semiconductor region of the second conductivity type provided between the third semiconductor region and the first plane, being in contact with the first trench, being separated from the third trench, and having a second conductivity type impurity concentration higher than a second conductivity type impurity concentration of the second semiconductor region; and a fifth semiconductor region of the second conductivity type provided between the third semiconductor region and the first plane, being in contact with the second trench, being separated from the fourth trench, and having a second conductivity type impurity concentration higher than a second conductivity type impurity concentration of the second semiconductor region. And, the semiconductor device includes: a first gate electrode provided in the first trench; a second gate electrode provided in the second trench; a third gate electrode provided in the third trench; a fourth gate electrode provided in the fourth trench; a first electrode provided on the side of the first plane of the semiconductor layer and being electrically connected to the fourth semiconductor region and the fifth semiconductor region, a first contact area being an area of a region where the first electrode contacting with the semiconductor layer between the first trench and the third trench, a second contact area being an area of a region where the first electrode contacting with the semiconductor layer between the third trench and the fourth trench, a third contact area being an area of a region where the first electrode contacting with the semiconductor layer between the second trench and the fourth trench, the first contact area being larger than the second contact area, and the third contact area being larger than the second contact area; a second electrode provided on a side of the second plane of the semiconductor layer and being electrically connected to the first semiconductor region; a first gate electrode pad provided on the side of the first plane of the semiconductor layer, being electrically connected to the first gate electrode and the second gate electrode, and being applied with a first gate voltage; and a second gate electrode pad provided on the side of the first plane of the semiconductor layer, being electrically connected to the third gate electrode and the fourth gate electrode, and being applied with a second gate voltage.

A semiconductor circuit according to the first embodiment includes the semiconductor device and a control circuit driving the semiconductor device and changing the second gate voltage from a first voltage to a second voltage before changing the first gate voltage from a turn-on voltage to a turn-off voltage, in which the second voltage is a negative voltage in a case where the first conductivity type is p-type, and the second voltage is a positive voltage in a case where the first conductivity type is n-type.

The semiconductor circuit according to the first embodiment is configured to include a semiconductor device and a control circuit that controls the semiconductor device.

The semiconductor device according to the first embodiment is a trench gate type IGBT 100 having a gate electrode in a trench formed in a semiconductor layer. The IGBT 100 is an IGBT capable of double gate driving. Hereinafter, a case where the first conductivity type is p-type and the second conductivity type is n-type will be described as an example.

The control circuit according to the first embodiment is a gate driver circuit 150.

Figure 2:
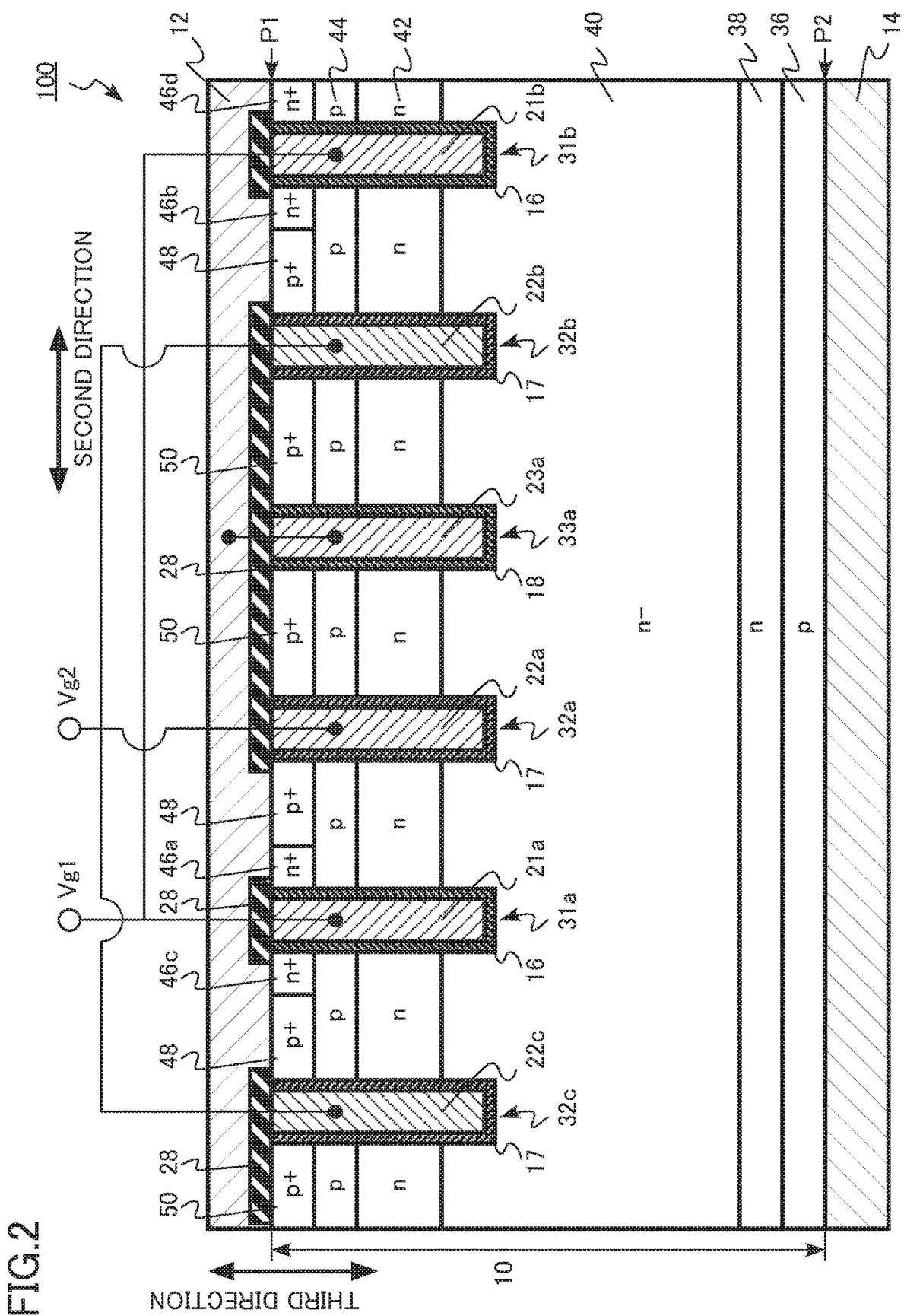
FIG. 2 is a schematic cross-sectional diagram of a portion of the semiconductor device according to the first embodiment.
Figure 3:
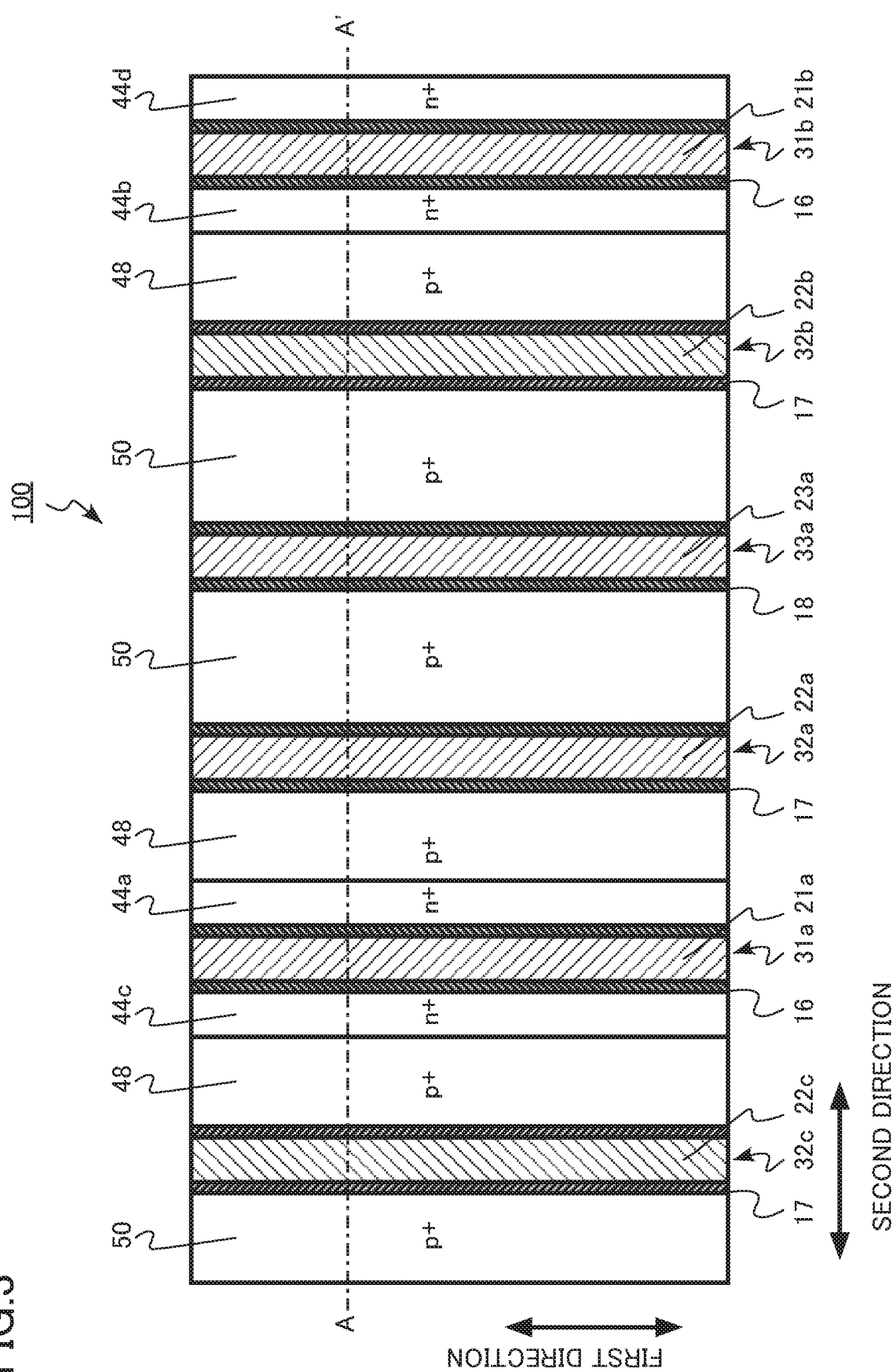
FIG. 3 is a schematic top diagram of a portion of the semiconductor device according to the first embodiment.

FIG. 1 is a schematic diagram of the semiconductor circuit according to the first embodiment. FIG. 1 illustrates disposition and connection relationship of a main gate trench, a control gate trench, a dummy gate trench, a main gate electrode, a control gate electrode, a dummy gate electrode, a main gate insulating film, a control gate insulating film, a dummy gate insulating film, a first gate electrode pad, a second gate electrode pad, and a control circuit. FIG. 2 is a schematic cross-sectional diagram of a portion of the semiconductor device according to the first embodiment. FIG. 3 is a schematic top diagram of a portion of the semiconductor device according to the first embodiment. FIG. 3 is a top diagram of a first plane P1. FIG. 2 illustrates a cross section taken along the line AA' of FIG. 3.

The IGBT 100 according to the first embodiment includes a semiconductor layer 10, an emitter electrode 12 (first electrode), a collector electrode 14 (second electrode), a main gate insulating film 16, a control gate insulating film 17, a dummy gate insulating film 18, a main gate electrode 21a (first gate electrode), a main gate electrode 21b (second gate electrode), a control gate electrode 22a (third gate electrode), a control gate electrode 22b (fourth gate electrode), a control gate electrode 22c (sixth gate electrode), a control gate electrode 22d, a dummy gate electrode 23a (fifth gate electrode), a dummy gate electrode 23b, a dummy gate electrode 23c, an interlayer insulating layer 28, a first gate electrode pad 101, and a second gate electrode pad 102.

Hereinafter, in some cases, the main gate electrode 21a and the main gate electrode 21b may be collectively referred to as the main gate electrode 21. In addition, in some cases, the control gate electrode 22a, the control gate electrode 22b, the control gate electrode 22c, and the control gate electrode 22d may be collectively referred to as the control gate electrode 22. In addition, in some cases, the dummy gate electrode 23a, the dummy gate electrode 23b, and the dummy gate electrode 23c may be collectively referred to as the dummy gate electrode 23.

In the semiconductor layer 10, a main gate trench 31a (first trench), a main gate trench 31b (second trench), a control gate trench 32a (third trench), a control gate trench 32b (fourth trench), a control gate trench 32c (sixth trench), a control gate trench 32d, a dummy gate trench 33a (fifth trench), a dummy gate trench 33b, a dummy gate trench 33c, a collector region 36 (first semiconductor region), a buffer region 38, a drift region 40 (second semiconductor region), a barrier region 42, a base region 44 (third semiconductor region), an emitter region 46a (fourth semiconductor region), an emitter region 46b (fifth semiconductor region), an emitter region 46c (sixth semiconductor region), an emitter region 46d, a contact region 48 (seventh semiconductor region), a p-type region 50 (eighth semiconductor region) are provided.

Hereinafter, in some cases, the main gate trench 31a and the main gate trench 31b may be collectively referred to as the main gate trench 31. In addition, in some cases, the control gate trench 32a, the control gate trench 32b, the control gate trench 32c, and the control gate trench 32d may be collectively referred to as the control gate trench 32. In addition, in some cases, the dummy gate trench 33a, the dummy gate trench 33b, and the dummy gate trench 33c may be collectively referred to as the dummy gate trench 33. In addition, in some cases, the emitter region 46a, the emitter region 46b, the emitter region 46c, and the emitter region 46d may be collectively referred to as the emitter region 46.

The semiconductor layer 10 has a first plane P1 and a second plane P2 facing the first plane P1. The semiconductor layer 10 is made of, for example, single crystal silicon. The film thickness of the semiconductor layer 10 is, for example, 40 μm or more and 700 μm or less.

In this specification, one direction parallel to the first plane P1 is referred to as a first direction. In addition, a direction parallel to the first plane P1 and perpendicular to the first direction is referred to as a second direction. In addition, a normal line direction of the first plane P1 is referred to as a third direction. In addition, in this specification, "depth" is defined as a distance in the third direction based on the first plane P1 as a reference.

The emitter electrode 12 is provided on a side of the first plane P1 of the semiconductor layer 10. At least a portion of the emitter electrode 12 is in contact with the first plane P1 of the semiconductor layer 10. The emitter electrode 12 is made of, for example, a metal.

The emitter electrode 12 is electrically connected to the emitter region 46, the contact region 48, and the base region 44. The emitter electrode 12 is electrically connected to the emitter region 46a, the emitter region 46b, the emitter region 46c, and the emitter region 46d. An emitter voltage is applied to the emitter electrode 12. The emitter voltage is, for example, 0 V.

The area of a region where the semiconductor layer 10 and the emitter electrode 12 are in contact with each other between the main gate trench 31a and the control gate trench 32a is defined as a first contact area. In addition, the area of a region where the semiconductor layer 10 and the emitter electrode 12 are in contact with each other between the control gate trench 32a and the control gate trench 32b is defined as a second contact area.

The first contact area is larger than the second contact area. The first contact area is, for example, 10 times or more the second contact area. For example, in the region between the control gate trench 32a and the control gate trench 32b, the semiconductor layer 10 and the emitter electrode 12 is not in contact with each other.

The area of the region where the semiconductor layer 10 and the emitter electrode 12 are in contact with each other between the main gate trench 31b and the control gate trench 32b is defined as a third contact area. The third contact area is larger than the second contact area. The third contact area is, for example, 10 times or more the second contact area.

In the cross section of FIG. 2, the semiconductor layer 10 and the emitter electrode 12 between the control gate trench 32a and the control gate trench 32b are not in contact with each other at all. A configuration where the semiconductor layer 10 and the emitter electrode 12 are in contact with each other in a portion between the control gate trench 32a and the control gate trench 32b can also be employed. A configuration where the semiconductor layer 10 and the emitter electrode 12 are not in contact at all in the entire region between the control gate trench 32a and the control gate trench 32b can also be employed. In this case, the second contact area is zero.

The collector electrode 14 is provided on a side of the second plane P2 of the semiconductor layer 10. At least a portion of the collector electrode 14 is in contact with the second plane P2 of the semiconductor layer 10. The collector electrode 14 is made of, for example, a metal.

The collector electrode 14 is electrically connected to the p-type collector region 36. A collector voltage is applied to the collector electrode 14. The collector voltage is, for example, 200 V or more and 6500 V or less.

The collector region 36 is a p-type semiconductor region. The collector region 36 is electrically connected to the collector electrode 14. The collector region 36 is in contact with the collector electrode 14.

The collector region 36 serves as a hole supply source at the time of the ON state of the IGBT 100.

The buffer region 38 is an n-type semiconductor region. The buffer region 38 is provided between the collector region 36 and the first plane P1. The buffer region 38 has a function of suppressing the expansion of the depletion layer at the time of the OFF state of the IGBT 100. A configuration where the buffer region 38 is not provided can also be employed.

The drift region 40 is an n-type semiconductor region. The drift region 40 is provided between the collector region 36 and the first plane P1. The drift region 40 is provided between the buffer region 38 and the first plane P1. The n-type impurity concentration of the drift region 40 is lower than the n-type impurity concentration of the buffer region 38.

The drift region 40 serves as a path of the ON-current at the time of the ON state of the IGBT 100. The drift region 40 has a function of being depleted at the time of the OFF state of the IGBT 100 and maintaining the breakdown voltage of the IGBT 100.

The barrier region 42 is an n-type semiconductor region. The barrier region 42 is provided between the drift region 40 and the first plane P1. The barrier region 42 is provided between the drift region 40 and the base region 44.

The n-type impurity concentration of the barrier region 42 is higher than the n-type impurity concentration of the drift region 40. The maximum concentration of n-type impurities in the barrier region 42 is, for example, 100 times or more the concentration of n-type impurities in the drift region 40.

By providing the barrier region 42 having an n-type impurity concentration higher than that of the drift region 40 on the side of the first plane P1, the discharge of the holes in the drift region 40 to the emitter electrode 12 is restricted at the time of the ON state of the IGBT 100. Therefore, the carrier concentration on the side of the first plane P1 of the drift region 40 is increased. Therefore, the barrier region 42 has a function of reducing the on-resistance of the IGBT 100.

The drift region 40 and the barrier region 42 are the same n-type impurity region, and the n-type impurity concentration is continuously increased from the drift region 40 toward the barrier region 42. In addition, a configuration where the barrier region 42 is not provided can also be employed.

The base region 44 is a p-type semiconductor region. The base region 44 is provided between the drift region 40 and the first plane P1. The base region 44 is provided between the barrier region 42 and the first plane P1.

The depth of the base region 44 is, for example, 4 μm or less. An inversion layer is formed in the region of the base region 44 facing the main gate electrode 21 at the time of the ON state of the IGBT 100. The base region 44 functions as a channel region of the transistor.

The emitter region 46 is an $n^+$-type semiconductor region. The emitter region 46 is provided between the base region 44 and the first plane P1. The emitter region 46 extends in the first direction on the first plane P1.

The emitter region 46 is in contact with the main gate trench 31. The emitter region 46 is in contact with the main gate insulating film 16. The emitter region 46 is separated from the control gate trench 32. The emitter region 46 is not in contact with the control gate trench 32. The emitter region 46 is separated from the control gate insulating film 17. The emitter region 46 is not in contact with the control gate insulating film 17.

The emitter region 46a is provided between the main gate trench 31a and the control gate trench 32a. The emitter region 46a is in contact with the main gate trench 31a. The emitter region 46a is separated from the control gate trench 32a.

The emitter region 46b is provided between the main gate trench 31b and the control gate trench 32b. The emitter region 46b is in contact with the main gate trench 31b. The emitter region 46a is separated from the control gate trench 32b.

The emitter region 46c is provided between the main gate trench 31a and the control gate trench 32c. The emitter region 46c is in contact with the main gate trench 31a. The emitter region 46a is separated from the control gate trench 32c.

The n-type impurity concentration of the emitter region 46 is higher than the n-type impurity concentration of the drift region 40.

The emitter region 46 is electrically connected to the emitter electrode 12. The emitter region 46 is in contact with the emitter electrode 12. The emitter region 46 serves as an electron supply source at the time of the ON state of the transistor having the main gate electrode 21.

The contact region 48 is a $p^+$-type semiconductor region. The contact region 48 is provided between the base region 44 and the first plane P1. The contact region 48 extends in the first direction on the first plane P1.

The contact region 48 is electrically connected to the emitter electrode 12. The contact region between the contact region 48 and the emitter electrode 12 continuously extends in the first direction. The p-type impurity concentration of the contact region 48 is higher than the p-type impurity concentration of the base region 44.

The p-type region 50 is a $p^+$-type semiconductor region. The p-type region 50 is provided between the base region 44 and the first plane P1. The p-type region 50 extends in the first direction on the first plane P1. The p-type region 50 is electrically connected to, for example, the emitter electrode 12 in a region (not illustrated). The p-type impurity concentration of the contact region 48 is higher than the p-type impurity concentration of the base region 44.

The p-type region 50 is electrically connected to, for example, the emitter electrode 12 in a contact portion (not illustrated). The p-type region 50 and the emitter electrode 12 are in contact with each other in the contact portion. The contact portion is provided, for example, in a region outside the ends of the control gate trench 32 and the dummy gate trench 33. The contact portion is intermittently provided in the first direction, for example, in a region between the control gate trench 32 and the dummy gate trench 33.

The p-type region 50 has a function of reducing resistance between the contact portion and the base region 44 and facilitating the discharge of the holes from the base region 44.

In addition, a configuration where the p-type region 50 is not provided can also be employed.

As illustrated in FIG. 3, the main gate trench 31 extends on the first plane P1 in the first direction parallel to the first plane P1. The main gate trench 31a and the main gate trench 31b extend on the first plane P1 in the first direction parallel to the first plane P1.

The main gate trench 31 has a stripe shape. The plurality of main gate trenches 31 are repeatedly disposed, for example, in the second direction perpendicular to the first direction.

The main gate trench 31 penetrates the base region 44 and the barrier region 42 and reaches the drift region 40. The depth of the main gate trench 31 is, for example, 4 μm or more and 8 μm or less.

The main gate electrode 21 is provided in the main gate trench 31. The main gate electrode 21a is provided in the main gate trench 31a. The main gate electrode 21b is provided in the main gate trench 31b.

The main gate electrode 21 is made of, for example, a semiconductor or a metal. The main gate electrode 21 is made of, for example, an amorphous silicon or a polycrystalline silicon containing n-type impurities or p-type impurities.

The main gate electrode 21 is electrically connected to the first gate electrode pad 101. The main gate electrode 21a and the main gate electrode 21b are electrically connected to the first gate electrode pad 101.

The main gate insulating film 16 is provided between the main gate electrode 21 and the semiconductor layer 10. The main gate insulating film 16 is provided between the main gate electrode 21 and the drift region 40, between the main gate electrode 21 and the barrier region 42, between the main gate electrode 21 and the base region 44, and between the main gate electrode 21 and the emitter region 46. The main gate insulating film 16 is in contact with the drift region 40, the barrier region 42, the base region 44, and the emitter region 46. The main gate insulating film 16 is made of, for example, a silicon oxide.

As illustrated in FIG. 3, the control gate trench 32 extends on the first plane P1 in the first direction parallel to the first plane P1. The control gate trench 32a, the control gate trench 32b, the control gate trench 32c, and the control gate trench 32d extend on the first plane P1 in the first direction parallel to the first plane P1.

The control gate trench 32 has a stripe shape. The plurality of control gate trenches 32 are repeatedly disposed, for example, in the second direction perpendicular to the first direction.

The control gate trench 32 penetrates the base region 44 and the barrier region 42 and reaches the drift region 40. The depth of the control gate trench 32 is, for example, 4 µm or more and 8 µm or less.

The main gate trench 31a is located between the control gate trench 32a and the control gate trench 32c.

The control gate electrode 22 is provided in the control gate trench 32. The control gate electrode 22a is provided in the control gate trench 32a. The control gate electrode 22b is provided in the control gate trench 32b. The control gate electrode 22c is provided in the control gate trench 32c. The control gate electrode 22d is provided in the control gate trench 32d.

The control gate electrode 22 is made of, for example, a semiconductor or a metal. The control gate electrode 22 is made of, for example, an amorphous silicon or polycrystalline silicon containing n-type impurities or p-type impurities.

The control gate electrode 22 is electrically connected to the second gate electrode pad 102. The control gate electrode 22a, the control gate electrode 22b, the control gate electrode 22c, and the control gate electrode 22d are electrically connected to the second gate electrode pad 102.

The control gate insulating film 17 is provided between the control gate electrode 22 and the semiconductor layer 10. The control gate insulating film 17 is provided between the control gate electrode 22 and the drift region 40, between the control gate electrode 22 and the barrier region 42, between the control gate electrode 22 and the base region 44, and between the control gate electrode 22 and the contact region 48. The control gate insulating film 17 is in contact with the drift region 40, the barrier region 42, the base region 44, and the contact region 48. The control gate insulating film 17 is not in contact with the emitter region 46. The control gate insulating film 17 is separated from the emitter region 46. The control gate insulating film 17 is made of, for example, a silicon oxide.

As illustrated in FIG. 3, the dummy gate trench 33 extends on the first plane P1 in the first direction parallel to the first plane P1. The dummy gate trench 33a, the dummy gate trench 33b, and the dummy gate trench 33c extend on the first plane P1 in the first direction parallel to the first plane P1.

The dummy gate trench 33 has a stripe shape. The plurality of dummy gate trenches 33 are repeatedly disposed, for example, in the second direction perpendicular to the first direction.

The dummy gate trench 33 penetrates the base region 44 and the barrier region 42 and reaches the drift region 40. The depth of the dummy gate trench 33 is, for example, 4 µm or more and 8 µm or less.

The dummy gate electrode 23 is provided in the dummy gate trench 33. The dummy gate electrode 23a is provided in the dummy gate trench 33a. The dummy gate electrode 23b is provided in the dummy gate trench 33b. The dummy gate electrode 23c is provided in the dummy gate trench 33c.

The dummy gate electrode 23 is made of, for example, a semiconductor or a metal. The dummy gate electrode 23 is made of, for example, an amorphous silicon or a polycrystalline silicon containing n-type impurities or p-type impurities.

The dummy gate electrode 23 is electrically connected to the emitter electrode 12, for example. The dummy gate electrode 23a, the dummy gate electrode 23b, and the dummy gate electrode 23c are electrically connected to the emitter electrode 12, for example.

The dummy gate insulating film 18 is provided between the dummy gate electrode 23 and the semiconductor layer 10. The dummy gate insulating film 18 is provided between the dummy gate electrode 23 and the drift region 40, between the dummy gate electrode 23 and the barrier region 42, between the dummy gate electrode 23 and the base region 44, and between the dummy gate electrode 23 and the p-type region 50. The dummy gate insulating film 18 is in contact with the drift region 40, the barrier region 42, the base region 44, and the p-type region 50. The dummy gate insulating film 18 is not in contact with the emitter region 46. The dummy gate insulating film 18 is made of, for example, a silicon oxide.

In the IGBT 100, the main gate trench 31 is provided adjacent to the control gate trench 32. In the IGBT 100, the main gate electrode 21 is provided adjacent to the control gate electrode 22.

In the IGBT 100, at least one dummy gate trench 33 is provided between the two control gate trenches 32. At least one dummy gate electrode 23 is provided between the two control gate electrodes 22.

The interlayer insulating layer 28 is provided between the main gate electrode 21 and the emitter electrode 12, between the control gate electrode 22 and the emitter electrode 12, and between the dummy gate electrode 23 and the emitter electrode 12. The interlayer insulating layer 28 electrically separates the main gate electrode 21 and the emitter electrode 12, electrically separates the control gate electrode 22 and the emitter electrode 12, and electrically separates the dummy gate electrode 23 and the emitter electrode 12.

The interlayer insulating layer 28 is provided between the p-type region 50 and the emitter electrode 12. The interlayer insulating layer 28 electrically separates the p-type region 50 and the emitter electrode 12 immediately above the p-type region 50.

The first gate electrode pad 101 is provided on the side of the first plane P1 of the semiconductor layer 10. The first gate electrode pad 101 is electrically connected to the main gate electrode 21. The first gate electrode pad 101 and the main gate electrode 21 are connected by, for example, metal wiring (not illustrated). A first gate voltage (Vg1) is applied to the first gate electrode pad 101.

The second gate electrode pad 102 is electrically connected to the control gate electrode 22. The second gate electrode pad 102 and the control gate electrode 22 are connected by, for example, metal wiring (not illustrated). A second gate voltage (Vg2) is applied to the second gate electrode pad 102.

The gate driver circuit 150 is provided, for example, in the same module as the IGBT 100 or on the same circuit board as the IGBT 100. The gate driver circuit 150 has a function of driving the IGBT 100.

The gate driver circuit 150 has a function of applying a desired first gate voltage (Vg1) and a desired second gate voltage (Vg2) to the first gate electrode pad 101 and the second gate electrode pad 102 at a desired timing.

The gate driver circuit 150 changes the second gate voltage (Vg2) from the first voltage to the second voltage before changing the first gate voltage (Vg1) from the turn-on voltage to the turn-off voltage. The second voltage is a negative voltage in a case where the first conductivity type is p-type and a positive voltage in a case where the first conductivity type is n-type.

Next, a driving method for the IGBT 100 will be described.

Figure 4:
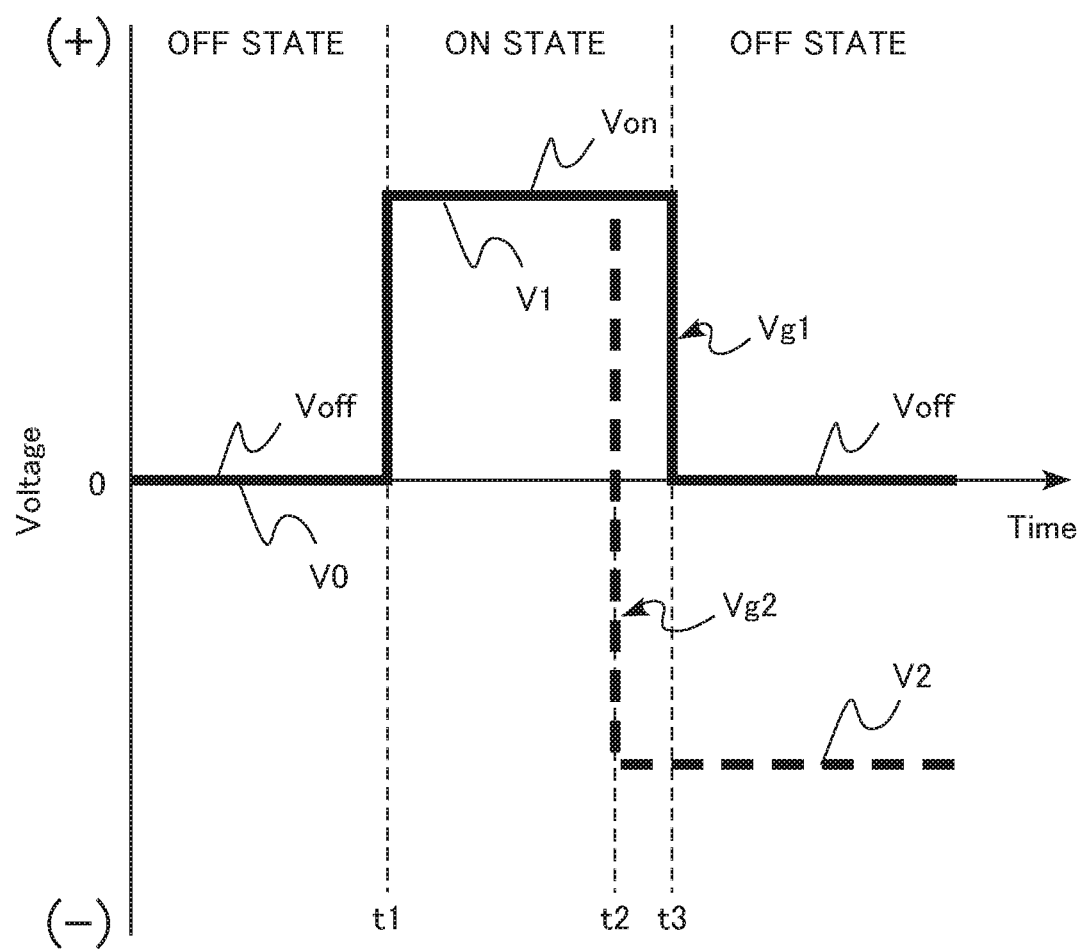
FIG. 4 is an explanatory diagram of a driving method for the semiconductor device according to the first embodiment.

FIG. 4 is an explanatory diagram of a driving method for the semiconductor device according to the first embodiment. FIG. 4 is a timing chart of the first gate voltage (Vg1) applied to the first gate electrode pad 101 and the second gate voltage (Vg2) applied to the second gate electrode pad 102.

Hereinafter, although the structure of the transistor having the main gate electrode 21 and the structure having the control gate electrode 22 are not structures clearly separated, for the convenience of operation description, these structures are referred to as a transistor having the main gate electrode 21.

In the OFF state of the IGBT 100, for example, the emitter voltage is applied to the emitter electrode 12. The emitter voltage is, for example, 0 V. The collector voltage is applied to the collector electrode 14. The collector voltage is, for example, 200 V or more and 6500 V or less.

In the OFF state of the IGBT 100, the turn-off voltage (Voff) is applied to the first gate electrode pad 101. The first gate voltage (Vg1) becomes the turn-off voltage (Voff). Therefore, the turn-off voltage (Voff) is also applied to the main gate electrode 21.

The turn-off voltage (Voff) is a voltage lower than the threshold voltage at which the transistor having the main gate electrode 21 is not in the turned-on state and is, for example, 0 V or a negative voltage.

In the OFF state, an n-type inversion layer is not formed to face the main gate electrode 21 in the base region 44 being in contact with the main gate insulating film 16.

In the OFF state of the IGBT 100, an initial voltage (V0) is applied to the second gate electrode pad 102. The initial voltage (V0) is, for example, a voltage at which a p-type inversion layer is not formed to face the control gate electrode 22 in the drift region 40 being in contact with the control gate insulating film 17. The initial voltage (V0) is, for example, 0 V or a positive voltage.

When the IGBT 100 is set to be in the turned-on state (time t1 in FIG. 4), the turn-on voltage (Von) is applied to the first gate electrode pad 101. The first gate voltage (Vg1) becomes the turn-on voltage (Von). The turn-on voltage (Von) is also applied to the main gate electrode 21.

The turn-on voltage (Von) is a positive voltage exceeding the threshold voltage of the transistor having the main gate electrode 21. The turn-on voltage (Von) is, for example, 15 V. By applying the turn-on voltage (Von) to the main gate electrode 21, the transistor having the main gate electrode 21 is in the turned-on state.

When the IGBT 100 is set to be in the turned-on state (time t1 in FIG. 4), the first voltage (V1) is applied to the second gate electrode pad 102. The second gate voltage (Vg2) becomes the first voltage (V1).

The first voltage (V1) is, for example, a positive voltage higher than the initial voltage (V0). The first voltage (V1) is, for example, equal to the turn-on voltage (Von). By applying the first voltage (V1) to the second gate electrode pad 102, an n-type storage layer is formed to face the control gate electrode 22 in the barrier region 42 being in contact with the control gate insulating film 17.

When the IGBT 100 is set to be in the turned-off state (time t3 in FIG. 4), the turn-off voltage (Voff) is applied to the first gate electrode pad 101. The first gate voltage (Vg1) becomes the turn-off voltage (Voff).

Before the first gate voltage (Vg1) is changed from the turn-on voltage (Von) to the turn-off voltage (Voff), that is, before the time t3, the second gate voltage (Vg2) is changed from the first voltage (V1) to the second voltage (V2). The voltage applied to the second gate electrode pad 102 is changed from the first voltage (V1) to the second voltage (V2) at the time t2.

The second voltage (V2) is a negative voltage. The second voltage (V2) is, for example, equal to or higher than −15 V and lower than 0 V. By applying the second voltage (V2) to the second gate electrode pad 102, the p-type inversion layer is formed to face the control gate electrode 22 in the drift region 40 being in contact with the control gate insulating film 17 and the barrier region 42 being in contact with the control gate insulating film 17.

The time length between time t2 and time t3 is, for example, 0.1 microseconds or more and 3 microseconds or less. The time length between the time t2 and the time t3 is, for example, 1 microsecond.

Next, the functions and effects of the semiconductor device according to the first embodiment will be described.

In order to reduce the on-resistance of the IGBT, it is effective to increase the carrier concentration of the drift region in the ON state. On the other hand, when the discharge of carriers from the drift region is delayed at the time of the turn-off of the IGBT, the turn-off time becomes long, and the switching loss is increased. It is preferable to achieve both the reduction of the on-resistance and the reduction of the switching loss.

In the IGBT 100 according to the first embodiment, in a case where the area of the region where the semiconductor layer 10 and the emitter electrode 12 are in contact with each other between the main gate trench 31a and the control gate trench 32a is defined as a first contact area, and the area of the region where the semiconductor layer 10 and the emitter electrode 12 are in contact with each other between the control gate trench 32a and the control gate trench 32b is defined as a second contact area, the first contact area is larger than the second contact area. In other words, the second contact area is less than the first contact area.

In the IGBT 100 according to the first embodiment, in a case where the area of the region where the semiconductor layer 10 and the emitter electrode 12 are in contact with each other between the main gate trench 31b and the control gate trench 32b is defined as the third contact area, and the area of the region where the semiconductor layer 10 and the emitter electrode 12 are in contact with each other between the control gate trench 32a and the control gate trench 32b is defined as the second contact area, the third contact area is larger than the second contact area. In other words, the second contact area is less than the third contact area.

In the IGBT 100, the area of the emitter electrode 12 that is in contact with the semiconductor layer 10 in the region between the control gate trench 32a and the control gate trench 32b is smaller than the area of the emitter electrode 12 that is in contact with the semiconductor layer 10 in the region between the main gate trench 31a and the control gate trench 32a. In addition, in the IGBT 100, the area of the emitter electrode 12 that is in contact with the semiconductor layer 10 in the region between the control gate trench 32a and the control gate trench 32b is smaller than the area of the emitter electrode 12 that is in contact with the semiconductor layer 10 in the region between the main gate trench 31b and the control gate trench 32b. Therefore, in the region between the control gate trench 32a and the control gate trench 32b, the discharge of the holes from the drift region 40 to the emitter electrode 12 is suppressed at the time of the ON state. Therefore, the on-resistance of the IGBT 100 is reduced.

From the viewpoint of reducing the on-resistance, it is preferable that the first contact area is 10 times or more the second contact area. From the viewpoint of reducing the on-resistance, it is preferable that the third contact area is 10 times or more the second contact area.

In addition, from the viewpoint of reducing the on-resistance, it is preferable that the semiconductor layer 10 and the emitter electrode 12 is not in contact with each other in the region between the control gate trench 32a and the control gate trench 32b. That is, it is preferable that the second contact area is zero.

In addition, in the IGBT 100, by providing the barrier region 42, the discharge of the holes in the drift region 40 to the emitter electrode 12 is restricted at the time of the ON state. Therefore, the on-resistance of the IGBT 100 is reduced. Furthermore, in the IGBT 100, the first voltage (V1) which is a positive voltage is applied to the second gate electrode pad 102 at the time of the ON state, so that the n-type storage layer is formed in the barrier region 42 in contact with the control gate insulating film 17. By forming the n-type storage layer, the discharge of the holes to the emitter electrode 12 through the barrier region 42 is further restricted. Therefore, the on-resistance of the IGBT 100 is further reduced.

As described above, in the IGBT 100, the on-resistance is reduced. However, since the carrier concentration of the drift region 40 in the ON state of the IGBT 100 is increased, the discharge of the holes from the drift region 40 is delayed when the IGBT 100 is set to be in the OFF state, so that there is a concern that the turn-off time is long.

The IGBT 100 according to the first embodiment includes a main gate electrode 21 in a main gate trench 31 and a control gate electrode 22 in a control gate trench 32. The first gate voltage (Vg1) applied to the main gate electrode 21 and the second gate voltage (Vg2) applied to the control gate electrode 22 are independently controlled.

The IGBT 100 sets the second gate voltage (Vg2) to a negative voltage before changing the first gate voltage (Vg1) from the turn-on voltage (Von) to the turn-off voltage (Voff). By setting the second gate voltage (Vg2) to a negative voltage, the p-type inversion layer is formed to face the control gate electrode 22 in the drift region 40 being in contact with the control gate insulating film 17 and the barrier region 42 being in contact with the control gate insulating film 17.

By setting the second gate voltage (Vg2) to a negative voltage, the p-type inversion layer can be formed in the barrier region 42 even the barrier region 42 has an n-type impurity concentration higher than that of the drift region 40.

The holes in the drift region 40 are discharged to the emitter electrode 12 through the p-type inversion layer. Therefore, the amount of carriers stored on the side of the first plane P1 of the drift region 40 is decreased.

When the first gate voltage (Vg1) is intended to be changed from the turn-on voltage (Von) to the turn-off voltage (Voff) (time t3 in FIG. 4), since the amount of carriers stored on the side of the first plane P1 of the drift region 40 has already been small, the turn-off time is shortened. Therefore, it is possible to reduce the switching loss of the IGBT 100.

In the IGBT 100 according to the first embodiment, by forming the p-type inversion layer in the barrier region 42 at the time of turn-off, the discharge of the holes from the drift region 40 is facilitated, and the turn-off time can be shortened. Therefore, it is possible to reduce the switching loss.

In addition, the first voltage (V1) may be set to, for example, 0 V.

In the IGBT 100, at the time of turn-off, a negative voltage is applied to the control gate electrode 22 to form the p-type inversion layer in the vicinity of the control gate trench 32, and a hole discharge path is formed. For this reason, the electric field strength in the vicinity of the control gate trench 32 becomes high, and the dynamic avalanche phenomenon occurs, so that there is a concern that the destruction and the long-term characteristic variation of the IGBT 100 occur. The long-term characteristic variation is, for example, a variation in switching characteristic caused by long-term use of the IGBT 100.

In the IGBT 100, the main gate trench 31 is provided adjacent to the control gate trench 32. In the IGBT 100, the main gate electrode 21 is provided adjacent to the control gate electrode 22.

The transistor having the main gate electrode 21 injects electrons from the emitter electrode 12 into the drift region 40. For this reason, in the IGBT 100, an electron injection path exists adjacent to the hole discharge path. Therefore, the electric field strength in the vicinity of the control gate trench 32 becomes low. Therefore, the destruction of the IGBT 100 and the long-term characteristic variation caused by the dynamic avalanche phenomenon are suppressed.

In addition, in the IGBT 100, the dummy gate trench 33a is provided between the control gate trench 32a and the control gate trench 32b. By providing the dummy gate trenches 33a between the control gate trenches 32a and the control gate trenches 32b, it is possible to provide the trenches to the semiconductor layer 10 at a constant interval. Therefore, it is possible to stably form the trench pattern.

In addition, by providing the dummy gate trench 33a, the electric field strength in the region between the control gate trench 32a and the control gate trench 32b in the OFF state of the IGBT 100 is relaxed, and the breakdown voltage of the IGBT 100 is improved.

As described above, according to the IGBT of the first embodiment, it is possible to reduce the on-resistance and to reduce the switching loss. In addition, according to the IGBT of the first embodiment, destruction caused by avalanche breakdown is suppressed.

Second Embodiment

A semiconductor device according to a second embodiment is different from that according to the first embodiment in that the semiconductor layer includes: a seventh trench provided on the side of the first plane, the first trench being located between the third trench and the seventh trench, the seventh trench extending in the first direction; and a seventh gate electrode provided in the seventh trench and being electrically connected to the first gate electrode pad And the fourth semiconductor region is provided between the first trench and the seventh trench.

A semiconductor circuit according to the second embodiment includes the semiconductor device and a control circuit driving the semiconductor device and changing the second gate voltage from a first voltage to a second voltage before changing the first gate voltage from a turn-on voltage to a turn-off voltage, in which the second voltage is a negative voltage in a case where the first conductivity type is p-type, and the second voltage is a positive voltage in a case where the first conductivity type is n-type.

Hereinafter, a portion of the description overlapping with that of the first embodiment will be omitted.

The semiconductor circuit according to the second embodiment is configured to include a semiconductor device and a control circuit that controls the semiconductor device.

The semiconductor device according to the second embodiment is a trench gate type IGBT 200 having a gate electrode in a trench formed in a semiconductor layer. The IGBT 200 is an IGBT capable of double gate driving. Hereinafter, a case where the first conductivity type is p-type and the second conductivity type is n-type will be described as an example.

The control circuit according to the second embodiment is a gate driver circuit 150.

Figure 5:
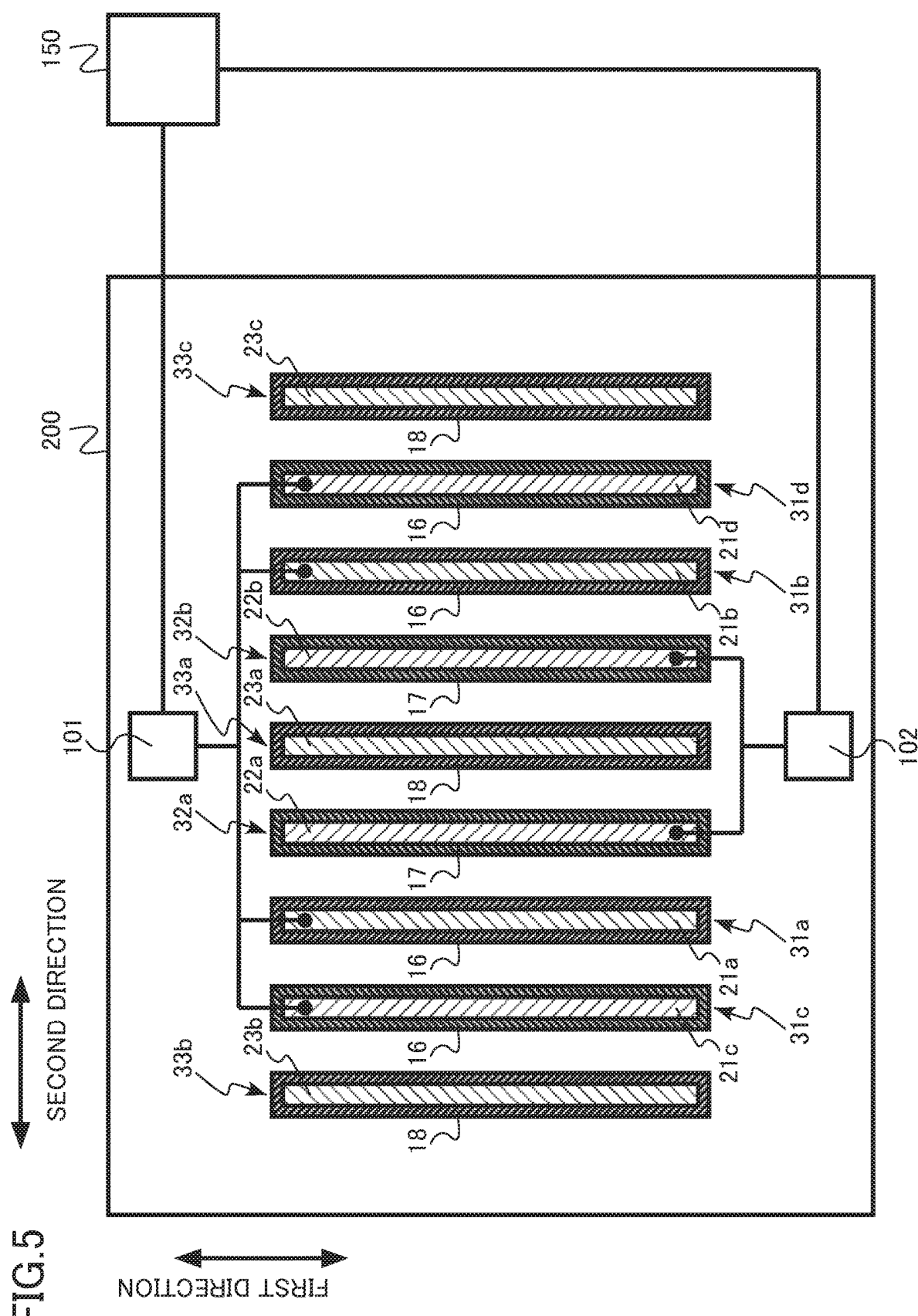
FIG. 5 is a schematic diagram of a semiconductor circuit according to a second embodiment.
Figure 6:
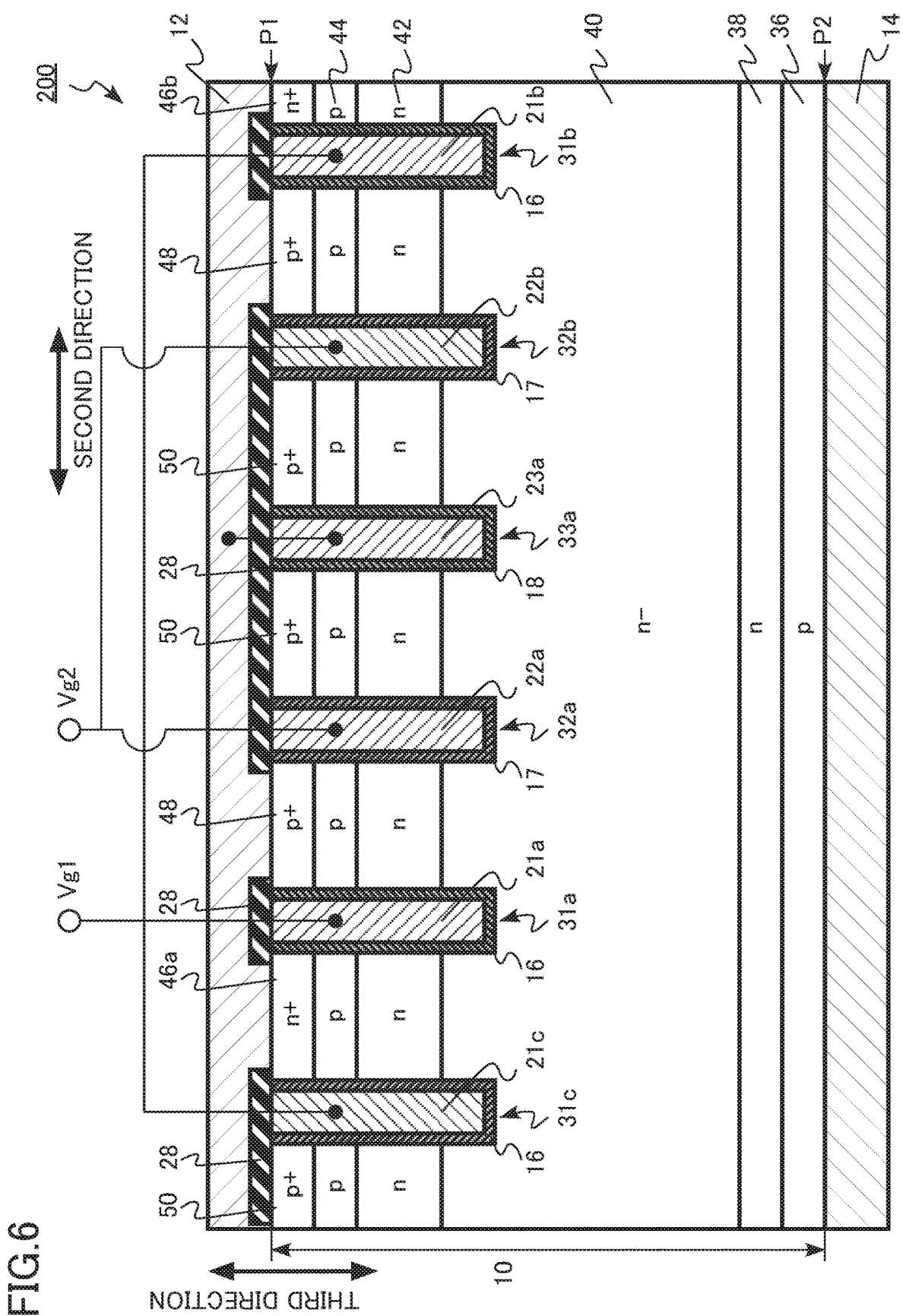
FIG. 6 is a schematic cross-sectional diagram of a portion of the semiconductor device according to the second embodiment.
Figure 7:
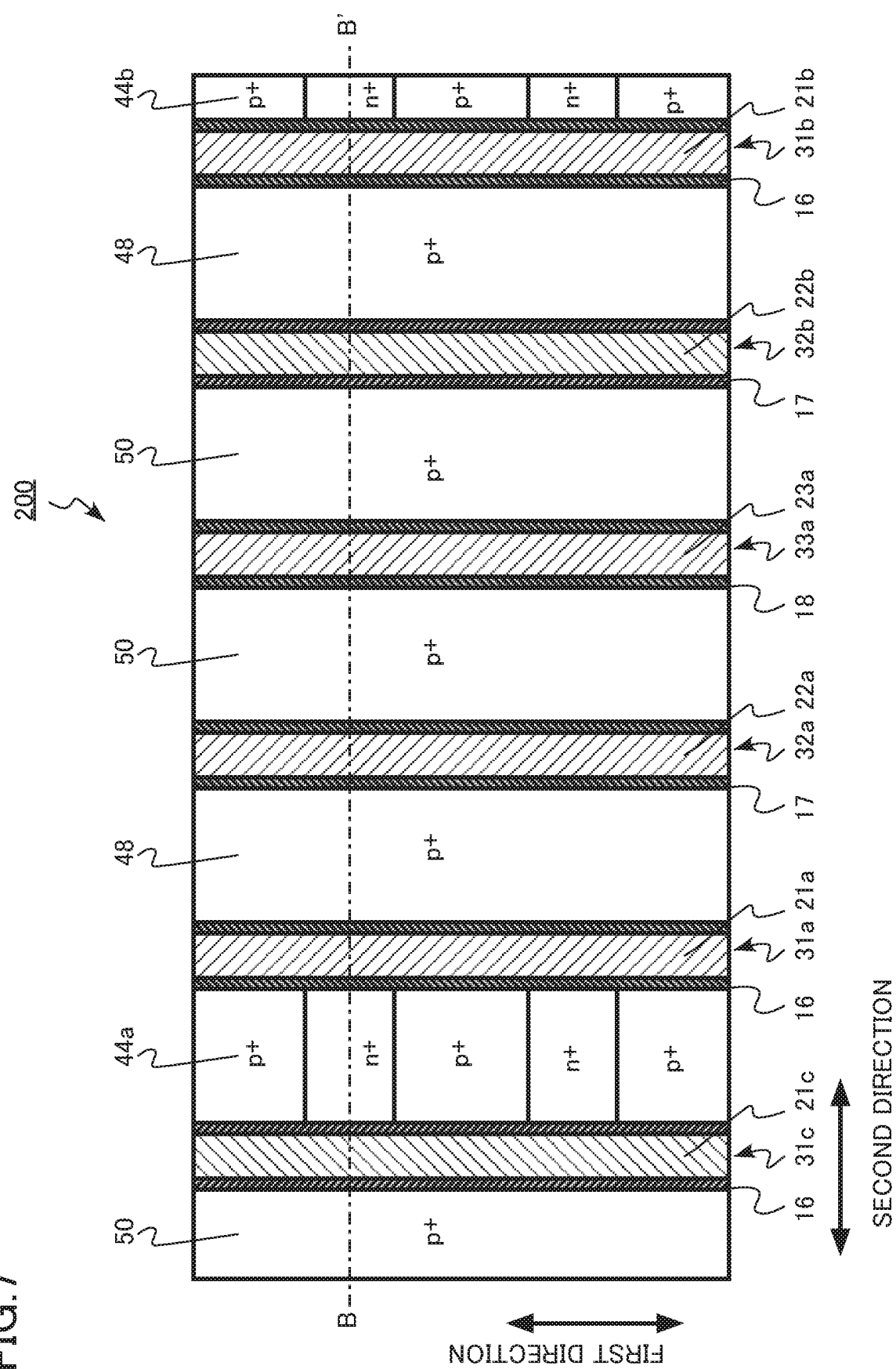
FIG. 7 is a schematic top diagram of a portion of the semiconductor device according to the second embodiment.

FIG. 5 is a schematic diagram of the semiconductor circuit according to the second embodiment. FIG. 5 illustrates disposition and connection relationship of a main gate trench, a control gate trench, a dummy gate trench, a main gate electrode, a control gate electrode, a dummy gate electrode, a main gate insulating film, a control gate insulating film, a dummy gate insulating film, a first gate electrode pad, a second gate electrode pad, and a control circuit. FIG. 6 is a schematic cross-sectional diagram of a portion of the semiconductor device according to the second embodiment. FIG. 7 is a schematic top diagram of a portion of the semiconductor device according to the second embodiment. FIG. 7 is a top diagram of the first plane P1. FIG. 6 illustrates a cross section taken along the line BB' of FIG. 7.

The IGBT 200 according to the second embodiment includes a semiconductor layer 10, an emitter electrode 12 (first electrode), a collector electrode 14 (second electrode), a main gate insulating film 16, a control gate insulating film 17, a dummy gate insulating film 18, a main gate electrode 21*a* (first gate electrode), a main gate electrode 21*b* (second gate electrode), a main gate electrode 21*c* (seventh gate electrode), a main gate electrode 21*d*, a control gate electrode 22*a* (third gate electrode), a control gate electrode 22*b* (fourth gate electrode), a dummy gate electrode 23*a* (fifth gate electrode), a dummy gate electrode 23*b*, a dummy gate electrode 23*c*, an interlayer insulating layer 28, a first gate electrode pad 101, and a second gate electrode pad 102.

Hereinafter, in some cases, the main gate electrode 21*a*, the main gate electrode 21*b*, the main gate electrode 21*c*, and the main gate electrode 21*d* may be collectively referred to as the main gate electrode 21. In addition, in some cases, the control gate electrode 22*a* and the control gate electrode 22*b* may be collectively referred to as the control gate electrode 22. In addition, in some cases, the dummy gate electrode 23*a*, the dummy gate electrode 23*b*, and the dummy gate electrode 23*c* may be collectively referred to as the dummy gate electrode 23.

In the semiconductor layer 10, a main gate trench 31*a* (first trench), a main gate trench 31*b* (second trench), a main gate trench 31*c* (seventh trench), a main gate trench 31*d*, a control gate trench 32*a* (third trench), a control gate trench 32*b* (fourth trench), a dummy gate trench 33*a* (fifth trench), a dummy gate trench 33*b*, a dummy gate trench 33*c*, a collector region 36 (first semiconductor region), a buffer region 38, a drift region 40 (second semiconductor region), a barrier region 42, a base region 44 (third semiconductor region), an emitter region 46*a* (fourth semiconductor region), an emitter region 46*b* (fifth semiconductor region), a contact region 48 (seventh semiconductor region), and a p-type region 50 (eighth semiconductor region) are provided.

Hereinafter, in some cases, the main gate trench 31*a*, the main gate trench 31*b*, and the main gate trench 31*c* may be collectively referred to as the main gate trench 31. In addition, in some cases, the control gate trench 32*a* and the control gate trench 32*b* may be collectively referred to as the control gate trench 32. In addition, in some cases, the dummy gate trench 33*a*, the dummy gate trench 33*b*, and the dummy gate trench 33*c* may be collectively referred to as the dummy gate trench 33. In addition, in some cases, the emitter region 46*a* and the emitter region 46*b* may be collectively referred to as the emitter region 46.

The emitter electrode 12 is electrically connected to the emitter region 46, the contact region 48, and the base region 44. The emitter electrode 12 is electrically connected to the emitter region 46*a* and the emitter region 46*b*. The emitter voltage is applied to the emitter electrode 12. The emitter voltage is, for example, 0 V.

The area of the region where the semiconductor layer 10 and the emitter electrode 12 are in contact with each other between the main gate trench 31*a* and the control gate trench 32*a* is defined as a first contact area. In addition, the area of the region where the semiconductor layer 10 and the emitter electrode 12 are in contact with each other between the control gate trench 32*a* and the control gate trench 32*b* is defined as a second contact area. In addition, the area of the region where the semiconductor layer 10 and the emitter electrode 12 are in contact with each other between the main gate trench 31*b* and the control gate trench 32*b* is defined as a third contact area.

The first contact area is larger than the second contact area. The first contact area is, for example, 10 times or more the second contact area. The third contact area is larger than the second contact area. The third contact area is, for example, 10 times or more the second contact area. For example, in the region between the control gate trench 32*a* and the control gate trench 32*b*, the semiconductor layer 10 and the emitter electrode 12 are not in contact with each other.

In the cross section of FIG. 6, the semiconductor layer 10 and the emitter electrode 12 between the control gate trench 32*a* and the control gate trench 32*b* are not in contact with each other at all. A configuration where the semiconductor layer 10 and the emitter electrode 12 are not in contact with each other at all between the control gate trench 32a and the control gate trench 32b can also be employed.

The emitter region 46 is an n⁺-type semiconductor region. The emitter region 46 is provided between the base region 44 and the first plane P1. The emitter region 46 extends in the first direction on the first plane P1.

The emitter region 46 is in contact with the main gate trench 31. The emitter region 46 is in contact with the main gate insulating film 16. The emitter region 46 is separated from the control gate trench 32. The emitter region 46 is separated from the control gate insulating film 17. The emitter region 46 is not in contact with the control gate insulating film 17.

The emitter region 46a is provided between the main gate trench 31a and the main gate trench 31c. The emitter region 46a is in contact with the main gate trench 31a and the main gate trench 31c. The emitter region 46a is separated from the control gate trench 32a.

The contact region 48 is a p⁺-type semiconductor region. The contact region 48 is provided between the base region 44 and the first plane P1. The contact region 48 extends in the first direction on the first plane P1. The contact region 48 is provided between the main gate trench 31 and the control gate trench 32.

As illustrated in FIG. 7, the main gate trench 31 extends on the first plane P1 in the first direction parallel to the first plane P1. The main gate trench 31a, the main gate trench 31b, the main gate trench 31c, and the main gate trench 31d extend on the first plane P1 in the first direction parallel to the first plane P1.

The main gate trench 31 has a stripe shape. The plurality of main gate trenches 31 are repeatedly disposed, for example, in the second direction perpendicular to the first direction.

The main gate electrode 21 is provided in the main gate trench 31. The main gate electrode 21a is provided in the main gate trench 31a. The main gate electrode 21b is provided in the main gate trench 31b. The main gate electrode 21c is provided in the main gate trench 31c. The main gate electrode 21d is provided in the main gate trench 31d.

The main gate electrode 21 is electrically connected to the first gate electrode pad 101. The main gate electrode 21a, the main gate electrode 21b, the main gate electrode 21c, and the main gate electrode 21d are electrically connected to the first gate electrode pad 101.

As illustrated in FIG. 7, the control gate trench 32 extends on the first plane P1 in the first direction parallel to the first plane P1. The control gate trench 32a and the control gate trench 32b extend on the first plane P1 in the first direction parallel to the first plane P1.

The control gate trench 32 has a stripe shape. The plurality of control gate trenches 32 are repeatedly disposed, for example, in the second direction perpendicular to the first direction.

The main gate trench 31a is located between the control gate trench 32a and the main gate trench 31c.

The control gate electrode 22 is provided in the control gate trench 32. The control gate electrode 22a is provided in the control gate trench 32a. The control gate electrode 22b is provided in the control gate trench 32b.

The control gate electrode 22 is electrically connected to the second gate electrode pad 102. The control gate electrodes 22a and 22b are electrically connected to the second gate electrode pad 102.

As illustrated in FIG. 7, the dummy gate trench 33 extends on the first plane P1 in the first direction parallel to the first plane P1. The dummy gate trench 33a, the dummy gate trench 33b, and the dummy gate trench 33c extend on the first plane P1 in the first direction parallel to the first plane P1.

The dummy gate trench 33 has a stripe shape. The plurality of dummy gate trenches 33 are repeatedly disposed, for example, in the second direction perpendicular to the first direction.

In the IGBT 200, the main gate trench 31 is provided adjacent to the control gate trench 32. In the IGBT 200, the main gate electrode 21 is provided adjacent to the control gate electrode 22.

In the IGBT 200, at least one dummy gate trench 33 is provided between the two control gate trenches 32. At least one dummy gate electrode 23 is provided between the two control gate electrodes 22.

The driving method for the IGBT 200 is the same as the driving method for the IGBT 100.

Similarly to the IGBT 100 according to the first embodiment, in the IGBT 200, it is possible to reduce the on-resistance and to reduce the switching loss. In addition, destruction caused by avalanche breakdown is suppressed.

Furthermore, in the IGBT 200, the emitter region 46a is provided between the main gate trench 31a and the main gate trench 31c. Therefore, no boundary between the emitter region 46 and the contact region 48 is provided between the trenches. Therefore, the pattern formation of the emitter region 46 becomes easy.

As described above, according to the IGBT of the second embodiment, it is possible to reduce the on-resistance and to reduce the switching loss. In addition, according to the IGBT of the second embodiment, the destruction caused by the avalanche breakdown is suppressed. In addition, according to the IGBT of the second embodiment, the pattern formation of the emitter region becomes easy.

Third Embodiment

A semiconductor device according to a third embodiment is different from that according to the first embodiment in that the semiconductor device does not include the fifth trench. Hereinafter, a portion of the description overlapping with that of the first embodiment will be omitted.

The semiconductor device according to the third embodiment is a trench gate type IGBT 300 having a gate electrode in a trench formed in a semiconductor layer.

Figure 8:
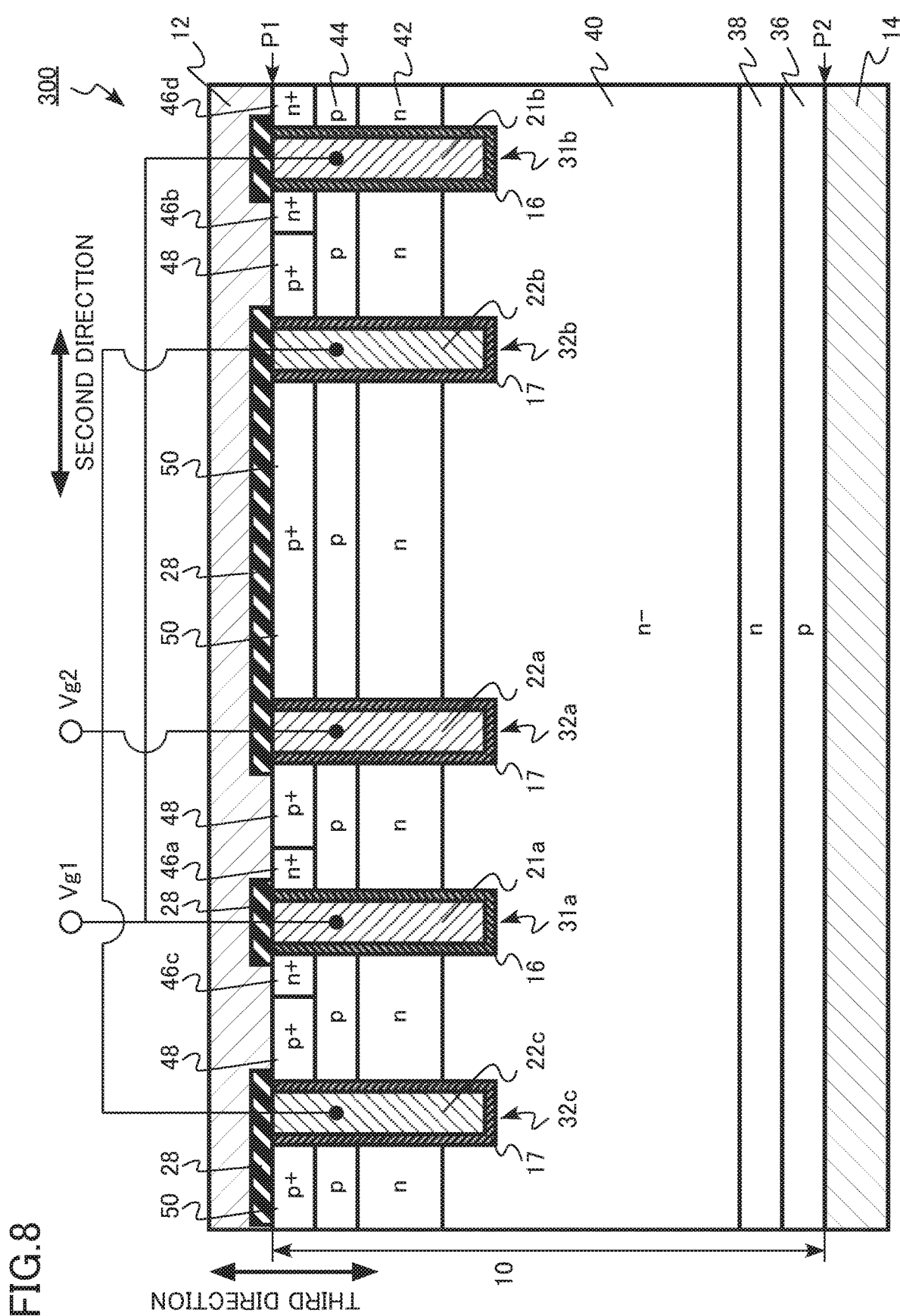
FIG. 8 is a schematic cross-sectional diagram of a portion of a semiconductor device according to a third embodiment.

FIG. 8 is a schematic cross-sectional diagram of a portion of the semiconductor device according to the third embodiment.

In the IGBT 300, the dummy gate trench is not provided between the control gate trench 32a and the control gate trench 32b.

Similarly to the IGBT 100 according to the first embodiment, in the IGBT 300, it is possible to reduce the on-resistance and to reduce the switching loss. In addition, destruction caused by avalanche breakdown is suppressed.

Fourth Embodiment

A semiconductor device according to a fourth embodiment includes: a semiconductor layer including a first plane and a second plane facing the first plane, the semiconductor layer includes: a first trench provided on a side of the first plane and extending in a first direction parallel to the first plane; a second trench provided on the side of the first plane and extending in the first direction; a third trench provided between the first trench and the second trench on the side of the first plane, being adjacent to the first trench, and extending in the first direction; a fourth trench provided between the third trench and the second trench on the side of the first plane, being adjacent to the second trench, and extending in the first direction; a first semiconductor region of a first conductivity type; a second semiconductor region of a second conductivity type provided between the first semiconductor region and the first plane; a third semiconductor region of the first conductivity type provided between the second semiconductor region and the first plane; a fourth semiconductor region of the second conductivity type provided between the third semiconductor region and the first plane, being in contact with the first trench, being separated from the third trench, and having a second conductivity type impurity concentration higher than a second conductivity type impurity concentration of the second semiconductor region; and a fifth semiconductor region of the second conductivity type provided between the third semiconductor region and the first plane, being in contact with the second trench, being separated from the fourth trench, and having a second conductivity type impurity concentration higher than a second conductivity type impurity concentration of the second semiconductor region. And, the semiconductor device includes: a first gate electrode provided in the first trench; a second gate electrode provided in the second trench; a third gate electrode provided in the third trench; a fourth gate electrode provided in the fourth trench; a first electrode provided on the side of the first plane of the semiconductor layer and being electrically connected to the fourth semiconductor region and the fifth semiconductor region, a first contact area being an area of a region where the first electrode contacting with the semiconductor layer between the first trench and the third trench, a second contact area being an area of a region where the first electrode contacting with the semiconductor layer between the third trench and the fourth trench, a third contact area being an area of a region where the first electrode contacting with the semiconductor layer between the second trench and the fourth trench, the first contact area being larger than the second contact area, and the third contact area being larger than the second contact area; a second electrode provided on a side of the second plane of the semiconductor layer and being electrically connected to the first semiconductor region; a first gate electrode pad provided on the side of the first plane of the semiconductor layer, being electrically connected to the first gate electrode and the second gate electrode, and being applied with a first gate voltage; and a second gate electrode pad provided on the side of the first plane of the semiconductor layer, being electrically connected to the third gate electrode, and being applied with a second gate voltage. And, the fourth gate electrode is electrically connected to the first electrode.

A semiconductor circuit according to the fourth embodiment includes the semiconductor device and a control circuit driving the semiconductor device and changing the second gate voltage from a first voltage to a second voltage before changing the first gate voltage from a turn-on voltage to a turn-off voltage, in which the second voltage is a negative voltage in a case where the first conductivity type is p-type, and the second voltage is a positive voltage in a case where the first conductivity type is n-type.

The semiconductor circuit according to the fourth embodiment is configured to include a semiconductor device and a control circuit that controls the semiconductor device.

The semiconductor device according to the fourth embodiment is different from the semiconductor device according to the first embodiment in that the fourth trench is a dummy trench instead of the control gate trench.

Hereinafter, a portion of the description overlapping with that of the first embodiment will be omitted.

The semiconductor device according to the fourth embodiment is a trench gate type IGBT 400 having a gate electrode in a trench formed in a semiconductor layer. The IGBT 400 is an IGBT capable of double gate driving. Hereinafter, a case where the first conductivity type is p-type and the second conductivity type is n-type will be described as an example.

The control circuit according to the fourth embodiment is the gate driver circuit 150.

Figure 9:
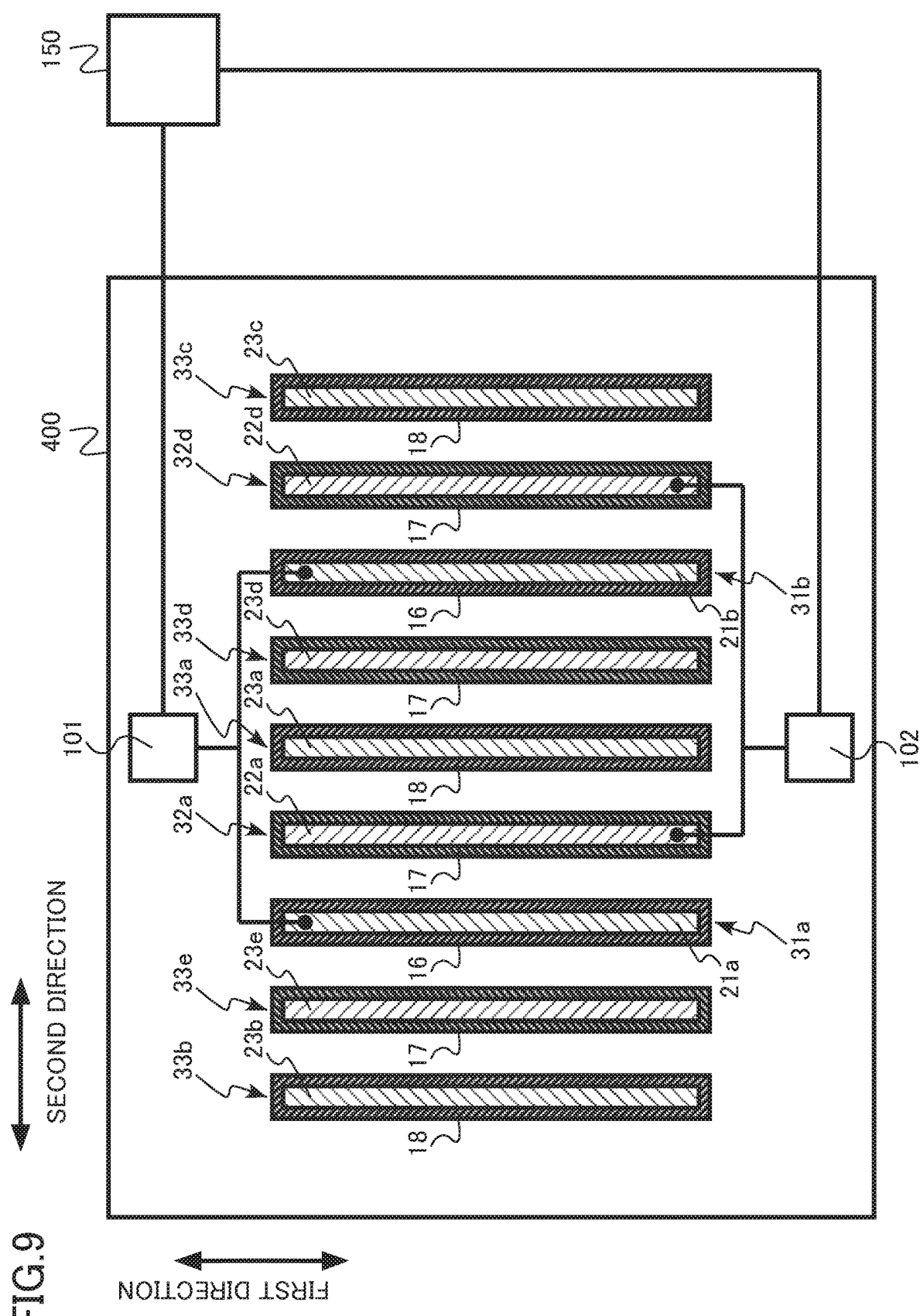
FIG. 9 is a schematic diagram of a semiconductor circuit according to a fourth embodiment.
Figure 10:
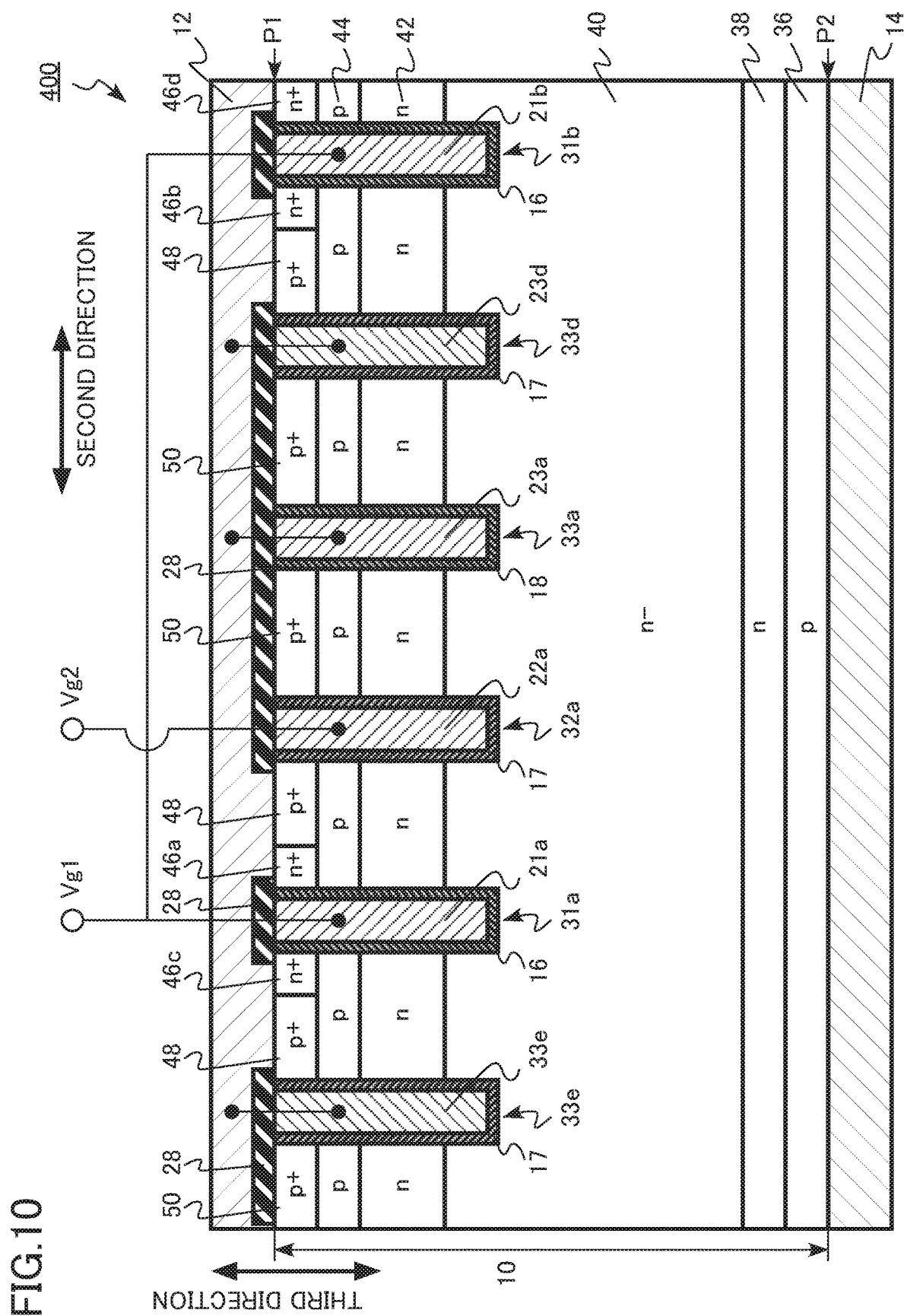
FIG. 10 is a schematic cross-sectional diagram of a portion of the semiconductor device according to the fourth embodiment.
Figure 11:
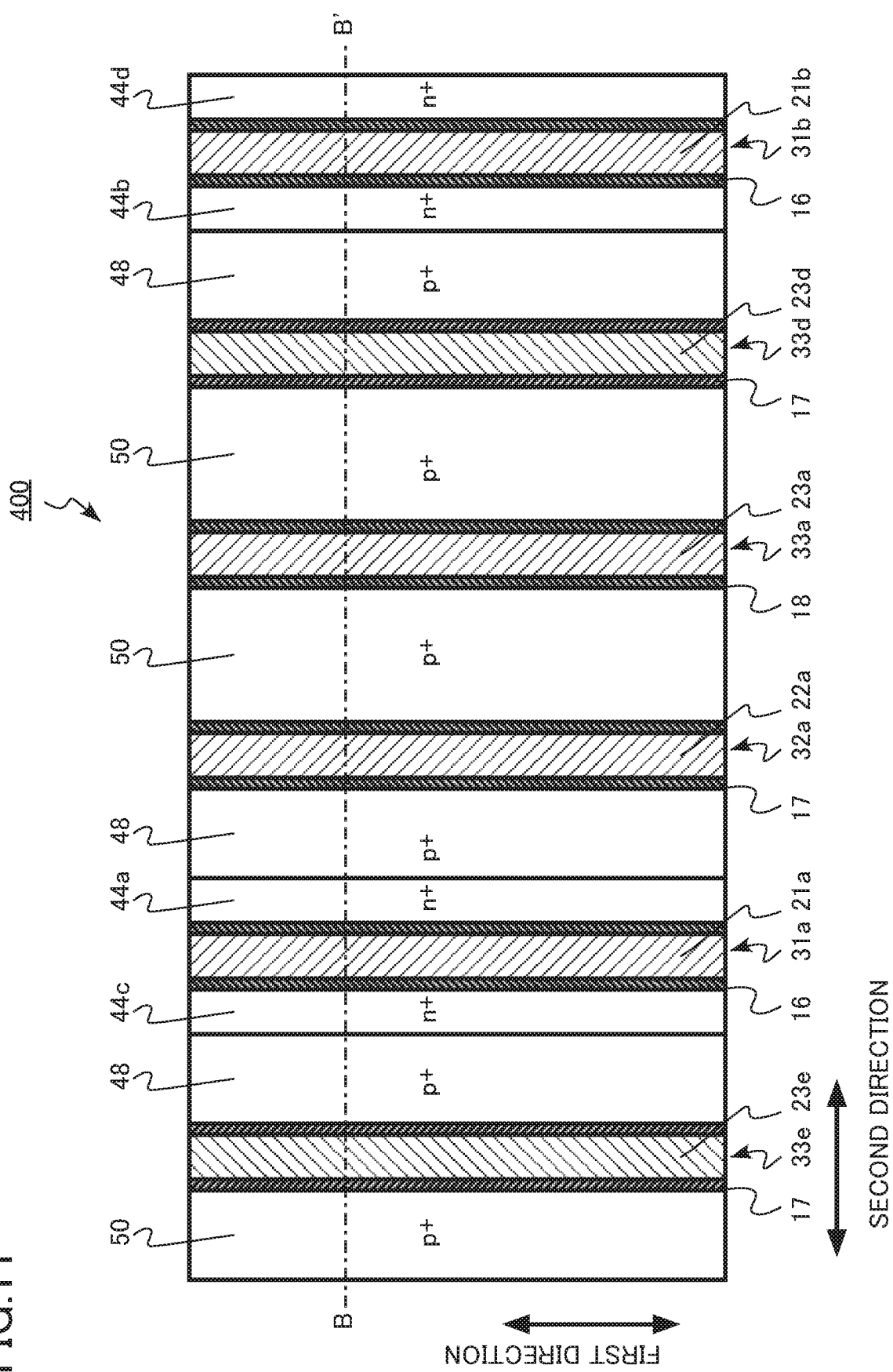
FIG. 11 is a schematic top diagram of a portion of the semiconductor device according to the fourth embodiment.

FIG. 9 is a schematic diagram of the semiconductor circuit according to the fourth embodiment. FIG. 9 illustrates disposition and connection relationship of a main gate trench, a control gate trench, a dummy gate trench, a main gate electrode, a control gate electrode, a dummy gate electrode, a main gate insulating film, a control gate insulating film, a dummy gate insulating film, a first gate electrode pad, a second gate electrode pad, and a control circuit. FIG. 10 is a schematic cross-sectional diagram of a portion of the semiconductor device according to the fourth embodiment. FIG. 11 is a schematic top diagram of a portion of the semiconductor device according to the fourth embodiment. FIG. 11 is a top diagram of the first plane P1. FIG. 10 illustrates a cross section taken along the line BB' of FIG. 11.

The IGBT 400 according to the fourth embodiment includes a semiconductor layer 10, an emitter electrode 12 (first electrode), a collector electrode 14 (second electrode), a main gate insulating film 16, a control gate insulating film 17, a dummy gate insulating film 18, a main gate electrode 21*a* (first gate electrode), a main gate electrode 21*b* (second gate electrode), a control gate electrode 22*a* (third gate electrode), a control gate electrode 22*d*, a dummy gate electrode 23*a* (fifth gate electrode), a dummy gate electrode 23*b*, a dummy gate electrode 23*c*, a dummy gate electrode 23*d* (fourth gate electrode), a dummy gate electrode 23*e*, an interlayer insulating layer 28, a first gate electrode pad 101, and a second gate electrode pad 102.

Hereinafter, in some cases, the main gate electrode 21*a* and the main gate electrode 21*b* may be collectively referred to as the main gate electrode 21. In addition, in some cases, the control gate electrode 22*a* and the control gate electrode 22*d* may be collectively referred to as the control gate electrode 22. In addition, in some cases, the dummy gate electrode 23*a*, the dummy gate electrode 23*b*, the dummy gate electrode 23*c*, the dummy gate electrode 23*d*, and the dummy gate electrode 23*e* may be collectively referred to as the dummy gate electrode 23.

Inside the semiconductor layer 10, a main gate trench 31*a* (first trench), a main gate trench 31*b* (second trench), a control gate trench 32*a* (third trench), a control gate trench 32*d*, a dummy gate trench 33*a* (fifth trench), a dummy gate trench 33*b*, a dummy gate trench 33*c*, a dummy gate trench 33*d* (fourth trench), a dummy gate trench 33*e*, a collector region 36 (first semiconductor region), a buffer region 38, a drift region 40 (second semiconductor region), a barrier region 42, a base region 44 (third semiconductor region), an emitter region 46*a* (fourth semiconductor region), an emitter region 46*b* (fifth semiconductor region), an emitter region 46*c* (sixth semiconductor region), an emitter region 46*d*, a contact region 48 (seventh semiconductor region), and a p-type region 50 (eighth semiconductor region) are provided.

Hereinafter, in some cases, the main gate trench 31*a* and the main gate trench 31*b* may be collectively referred to as the main gate trench 31. In addition, in some cases, the control gate trench 32a and the control gate trench 32d may be collectively referred to as the control gate trench 32. In addition, in some cases, the dummy gate trench 33a, the dummy gate trench 33b, and the dummy gate trench 33c may be collectively referred to as the dummy gate trench 33. In addition, in some cases, the emitter region 46a, the emitter region 46b, the emitter region 46c, and the emitter region 46d may be collectively referred to as the emitter region 46.

The semiconductor layer 10 has a first plane P1 and a second plane P2 facing the first plane P1. The semiconductor layer 10 is made of, for example, single crystal silicon. The film thickness of the semiconductor layer 10 is, for example, 40 μm or more and 700 μm or less.

In this specification, one direction parallel to the first plane P1 is referred to as a first direction. In addition, a direction parallel to the first plane P1 and perpendicular to the first direction is referred to as a second direction. Moreover, the normal line direction of the first plane P1 is referred to as a third direction. In addition, in this specification, "depth" is defined as a distance in the third direction based on the first plane P1 as a reference.

The emitter electrode 12 is provided on the side of the first plane P1 of the semiconductor layer 10. At least a portion of the emitter electrode 12 is in contact with the first plane P1 of the semiconductor layer 10. The emitter electrode 12 is made of, for example, a metal.

The emitter electrode 12 is electrically connected to the emitter region 46, the contact region 48, and the base region 44. The emitter electrode 12 is electrically connected to the emitter region 46a, the emitter region 46b, the emitter region 46c, and the emitter region 46d. The emitter voltage is applied to the emitter electrode 12. The emitter voltage is, for example, 0 V.

The area of the region where the semiconductor layer 10 and the emitter electrode 12 are in contact with each other between the main gate trench 31a and the control gate trench 32a is defined as a first contact area. In addition, the area of the region where the semiconductor layer 10 and the emitter electrode 12 are in contact with each other between the control gate trench 32a and the dummy gate trench 33d is defined as a second contact area.

The first contact area is larger than the second contact area. The first contact area is, for example, 10 times or more the second contact area. For example, in the region between the control gate trench 32a and the dummy gate trench 33d, the semiconductor layer 10 and the emitter electrode 12 is not in contact with each other.

The area of the region where the semiconductor layer 10 and the emitter electrode 12 are in contact with each other between the main gate trench 31b and the dummy gate trench 33d is defined as the third contact area. The third contact area is larger than the second contact area. The third contact area is, for example, 10 times or more the second contact area.

In the cross section of FIG. 10, the semiconductor layer 10 and the emitter electrode 12 between the control gate trench 32a and the dummy gate trench 33d are not in contact with each other at all. A configuration where the semiconductor layer 10 and the emitter electrode 12 are in contact with each other in a portion between the control gate trench 32a and the dummy gate trench 33d can also be employed. A configuration where the semiconductor layer 10 and the emitter electrode 12 are not in contact with each other at all in the entire region between the control gate trench 32a and the dummy gate trench 33d can also be employed. In this case, the second contact area is zero.

The collector electrode 14 is provided on the side of the second plane P2 of the semiconductor layer 10. At least a portion of the collector electrode 14 is in contact with the second plane P2 of the semiconductor layer 10. The collector electrode 14 is made of, for example, a metal.

The collector electrode 14 is electrically connected to the p-type collector region 36. The collector voltage is applied to the collector electrode 14. The collector voltage is, for example, 200 V or more and 6500 V or less.

The collector region 36 is ap-type semiconductor region. The collector region 36 is electrically connected to the collector electrode 14. The collector region 36 is in contact with the collector electrode 14.

The collector region 36 serves as a hole supply source at the time of the ON state of the IGBT 400.

The buffer region 38 is an n-type semiconductor region. The buffer region 38 is provided between the collector region 36 and the first plane P1. The buffer region 38 has a function of suppressing the expansion of the depletion layer at the time of the OFF state of the IGBT 400. A configuration where the buffer region 38 is not provided can also be employed.

The drift region 40 is an n$^-$-type semiconductor region. The drift region 40 is provided between the collector region 36 and the first plane P1. The drift region 40 is provided between the buffer region 38 and the first plane P1. The n-type impurity concentration of the drift region 40 is lower than the n-type impurity concentration of the buffer region 38.

The drift region 40 serves as a path of the ON-current at the time of the ON state of the IGBT 400. The drift region 40 has a function of being depleted at the time of the OFF state of the IGBT 400 and maintaining the breakdown voltage of the IGBT 400.

The barrier region 42 is an n-type semiconductor region. The barrier region 42 is provided between the drift region 40 and the first plane P1. The barrier region 42 is provided between the drift region 40 and the base region 44.

The n-type impurity concentration of the barrier region 42 is higher than the n-type impurity concentration of the drift region 40. The maximum concentration of n-type impurities in the barrier region 42 is, for example, 100 times or more the concentration of n-type impurities in the drift region 40.

By providing the barrier region 42 having an n-type impurity concentration higher than that of the drift region 40 on the side of the first plane P1, the discharge of the holes in the drift region 40 to the emitter electrode 12 is restricted at the time of the ON state of the IGBT 100. Therefore, the carrier concentration on the side of the first plane P1 of the drift region 40 is increased. Therefore, the barrier region 42 has a function of reducing the on-resistance of the IGBT 400.

In addition, the drift region 40 and the barrier region 42 are the same n-type impurity region, and the n-type impurity concentration is continuously increased from the drift region 40 toward the barrier region 42. In addition, a configuration where the barrier region 42 is not provided can also be employed.

The base region 44 is a p-type semiconductor region. The base region 44 is provided between the drift region 40 and the first plane P1. The base region 44 is provided between the barrier region 42 and the first plane P1.

The depth of the base region 44 is, for example, 4 μm or less. An inversion layer is formed in a region of the base region 44 facing the main gate electrode 21 in ON state of the IGBT 400. The base region 44 functions as a channel region of the transistor.

The emitter region 46 is an n$^+$-type semiconductor region. The emitter region 46 is provided between the base region 44 and the first plane P1. The emitter region 46 extends in the first direction on the first plane P1.

The emitter region 46 is in contact with the main gate trench 31. The emitter region 46 is in contact with the main gate insulating film 16. The emitter region 46 is separated from the control gate trench 32. The emitter region 46 is not in contact with the control gate trench 32. The emitter region 46 is separated from the control gate insulating film 17. The emitter region 46 is not in contact with the control gate insulating film 17.

The emitter region 46a is provided between the main gate trench 31a and the control gate trench 32a. The emitter region 46a is in contact with the main gate trench 31a. The emitter region 46a is separated from the control gate trench 32a.

The emitter region 46b is provided between the main gate trench 31b and the dummy gate trench 33d. The emitter region 46b is in contact with the main gate trench 31b. The emitter region 46a is separated from the dummy gate trench 33d.

The emitter region 46c is provided between the main gate trench 31a and the dummy gate trench 33e. The emitter region 46c is in contact with the main gate trench 31a. The emitter region 46a is separated from the dummy gate trench 33e.

The n-type impurity concentration of the emitter region 46 is higher than the n-type impurity concentration of the drift region 40.

The emitter region 46 is electrically connected to the emitter electrode 12. The emitter region 46 is in contact with the emitter electrode 12. The emitter region 46 serves as an electron supply source at the time of the ON state of the transistor having the main gate electrode 21.

The contact region 48 is a p$^+$-type semiconductor region. The contact region 48 is provided between the base region 44 and the first plane P1. The contact region 48 extends in the first direction on the first plane P1.

The contact region 48 is electrically connected to the emitter electrode 12. The contact region between the contact region 48 and the emitter electrode 12 continuously extends in the first direction. The p-type impurity concentration of the contact region 48 is higher than the p-type impurity concentration of the base region 44.

The p-type region 50 is a p$^+$-type semiconductor region. The p-type region 50 is provided between the base region 44 and the first plane P1. The p-type region 50 extends in the first direction on the first plane P1. The p-type region 50 is electrically connected to the emitter electrode 12 in a region (not illustrated), for example. The p-type impurity concentration of the contact region 48 is higher than the p-type impurity concentration of the base region 44.

The p-type region 50 is electrically connected to, for example, the emitter electrode 12 in a contact portion (not illustrated). The p-type region 50 and the emitter electrode 12 are in contact with each other in the contact portion. The contact portion is provided, for example, in a region outside the ends of the control gate trench 32 and the dummy gate trench 33. The contact portion is intermittently provided in the first direction, for example, in a region between the control gate trench 32 and the dummy gate trench 33.

The p-type region 50 has a function of reducing resistance between the contact portion and the base region 44 and facilitating the discharge of the holes from the base region 44.

In addition, a configuration where the p-type region 50 is not provided can also be employed.

As illustrated in FIG. 11, the main gate trench 31 extends on the first plane P1 in the first direction parallel to the first plane P1. The main gate trench 31a and the main gate trench 31b extend on the first plane P1 in the first direction parallel to the first plane P1.

The main gate trench 31 has a stripe shape. The plurality of main gate trenches 31 are repeatedly disposed, for example, in the second direction perpendicular to the first direction.

The main gate trench 31 penetrates the base region 44 and the barrier region 42 and reaches the drift region 40. The depth of the main gate trench 31 is, for example, 4 μm or more and 8 μm or less.

The main gate electrode 21 is provided in the main gate trench 31. The main gate electrode 21a is provided in the main gate trench 31a. The main gate electrode 21b is provided in the main gate trench 31b.

The main gate electrode 21 is made of, for example, a semiconductor or a metal. The main gate electrode 21 is made of, for example, an amorphous silicon or a polycrystalline silicon containing n-type impurities or p-type impurities.

The main gate electrode 21 is electrically connected to the first gate electrode pad 101. The main gate electrode 21a and the main gate electrode 21b are electrically connected to the first gate electrode pad 101.

The main gate insulating film 16 is provided between the main gate electrode 21 and the semiconductor layer 10. The main gate insulating film 16 is provided between the main gate electrode 21 and the drift region 40, between the main gate electrode 21 and the barrier region 42, between the main gate electrode 21 and the base region 44, and between the main gate electrode 21 and the emitter region 46. The main gate insulating film 16 is in contact with the drift region 40, the barrier region 42, the base region 44, and the emitter region 46. The main gate insulating film 16 is made of, for example, a silicon oxide.

As illustrated in FIG. 11, the control gate trench 32 extends on the first plane P1 in the first direction parallel to the first plane P1. The control gate trench 32a and the control gate trench 32d extend on the first plane P1 in the first direction parallel to the first plane P1.

The control gate trench 32 has a stripe shape. The plurality of control gate trenches 32 are repeatedly disposed, for example, in the second direction perpendicular to the first direction.

The control gate trench 32 penetrates the base region 44 and the barrier region 42 and reaches the drift region 40. The depth of the control gate trench 32 is, for example, 4 μm or more and 8 μm or less.

The main gate trench 31a is located between the control gate trench 32a and the control gate trench 32c.

The control gate electrode 22 is provided in the control gate trench 32. The control gate electrode 22a is provided in the control gate trench 32a. The control gate electrode 22d is provided in the control gate trench 32d.

The control gate electrode 22 is made of, for example, a semiconductor or a metal. The control gate electrode 22 is made of, for example, an amorphous silicon or a polycrystalline silicon containing n-type impurities or p-type impurities.

The control gate electrode 22 is electrically connected to the second gate electrode pad 102. The control gate electrode 22a and the control gate electrode 22d are electrically connected to the second gate electrode pad 102.

The control gate insulating film 17 is provided between the control gate electrode 22 and the semiconductor layer 10. The control gate insulating film 17 is provided between the control gate electrode 22 and the drift region 40, between the control gate electrode 22 and the barrier region 42, between the control gate electrode 22 and the base region 44, and between the control gate electrode 22 and the contact region 48. The control gate insulating film 17 is in contact with the drift region 40, the barrier region 42, the base region 44, and the contact region 48. The control gate insulating film 17 is not in contact with the emitter region 46. The control gate insulating film 17 is separated from the emitter region 46. The control gate insulating film 17 is made of, for example, a silicon oxide.

As illustrated in FIG. 11, the dummy gate trench 33 extends on the first plane P1 in the first direction parallel to the first plane P1. The dummy gate trench 33a, the dummy gate trench 33b, the dummy gate trench 33c, the dummy gate trench 33d, and the dummy gate trench 33e extend on the first plane P1 in the first direction parallel to the first plane P1.

The dummy gate trench 33 has a stripe shape. The plurality of dummy gate trenches 33 are repeatedly disposed, for example, in the second direction perpendicular to the first direction.

The dummy gate trench 33 penetrates the base region 44 and the barrier region 42 and reaches the drift region 40. The depth of the dummy gate trench 33 is, for example, 4 μm or more and 8 μm or less.

The dummy gate electrode 23 is provided in the dummy gate trench 33. The dummy gate electrode 23a is provided in the dummy gate trench 33a. The dummy gate electrode 23b is provided in the dummy gate trench 33b. The dummy gate electrode 23c is provided in the dummy gate trench 33c.

The dummy gate electrode 23 is made of, for example, a semiconductor or a metal. The dummy gate electrode 23 is made of, for example, an amorphous silicon or a polycrystalline silicon containing n-type impurities or p-type impurities.

The dummy gate electrode 23 is electrically connected to, for example, the emitter electrode 12. The dummy gate electrode 23a, the dummy gate electrode 23b, the dummy gate electrode 23c, the dummy gate electrode 23d, and the dummy gate electrode 23e are electrically connected to the emitter electrode 12.

The dummy gate insulating film 18 is provided between the dummy gate electrode 23 and the semiconductor layer 10. The dummy gate insulating film 18 is provided between the dummy gate electrode 23 and the drift region 40, between the dummy gate electrode 23 and the barrier region 42, between the dummy gate electrode 23 and the base region 44, and between the dummy gate electrode 23 and the p-type region 50. The dummy gate insulating film 18 is in contact with the drift region 40, the barrier region 42, the base region 44, and the p-type region 50. The dummy gate insulating film 18 is not in contact with the emitter region 46. The dummy gate insulating film 18 is made of, for example, a silicon oxide.

In the IGBT 400, the main gate trench 31 is provided adjacent to the control gate trench 32. In the IGBT 400, the main gate electrode 21 is provided adjacent to the control gate electrode 22.

In the IGBT 400, at least one dummy gate trench 33 is provided between the two control gate trenches 32. At least one dummy gate electrode 23 is provided between the two control gate electrodes 22.

The interlayer insulating layer 28 is provided between the main gate electrode 21 and the emitter electrode 12, between the control gate electrode 22 and the emitter electrode 12, and between the dummy gate electrode 23 and the emitter electrode 12. The interlayer insulating layer 28 electrically separates the main gate electrode 21 and the emitter electrode 12, electrically separates the control gate electrode 22 and the emitter electrode 12, and electrically separates the dummy gate electrode 23 and the emitter electrode 12.

The interlayer insulating layer 28 is provided between the p-type region 50 and the emitter electrode 12. The interlayer insulating layer 28 electrically separates the p-type region 50 and the emitter electrode 12 immediately above the p-type region 50.

The first gate electrode pad 101 is provided on the side of the first plane P1 of the semiconductor layer 10. The first gate electrode pad 101 is electrically connected to the main gate electrode 21. The first gate electrode pad 101 and the main gate electrode 21 are connected by, for example, metal wiring (not illustrated). A first gate voltage (Vg1) is applied to the first gate electrode pad 101.

The second gate electrode pad 102 is electrically connected to the control gate electrode 22. The second gate electrode pad 102 and the control gate electrode 22 are connected by, for example, metal wiring (not illustrated). A second gate voltage (Vg2) is applied to the second gate electrode pad 102.

The gate driver circuit 150 is provided, for example, in the same module as the IGBT 400 or on the same circuit board as the IGBT 400. The gate driver circuit 150 has a function of driving the IGBT 400.

The gate driver circuit 150 has a function of applying a desired first gate voltage (Vg1) and a desired second gate voltage (Vg2) to the first gate electrode pad 101 and the second gate electrode pad 102 at a desired timing.

The gate driver circuit 150 changes the second gate voltage (Vg2) from the first voltage to the second voltage before changing the first gate voltage (Vg1) from the turn-on voltage to the turn-off voltage. The second voltage is a negative voltage in a case where the first conductivity type is p-type, and the second voltage is a positive voltage in a case where the first conductivity type is n-type.

Next, the driving method for the IGBT 400 is the same as the driving method for the IGBT 100. Therefore, the description of the driving method for the IGBT 400 is omitted.

Next, the functions and effects of the semiconductor device according to the fourth embodiment will be described.

In order to reduce the on-resistance of the IGBT, it is effective to increase the carrier concentration of the drift region in the ON state. On the other hand, when the discharge of carriers from the drift region is delayed at the turn-off of the IGBT, the turn-off time becomes long, and the switching loss is increased. Therefore, it is preferable to achieve both reduction of on-resistance and reduction of switching loss.

In the IGBT 400 according to the fourth embodiment, in a case where the area of the region where the semiconductor layer 10 and the emitter electrode 12 are in contact with each other between the main gate trench 31a and the control gate trench 32a is defined as a first contact area, and the area of the region where the semiconductor layer 10 and the emitter electrode 12 are in contact with each other between the control gate trench 32a and the dummy gate trench 33d is defined as a second contact area, the first contact area is larger than the second contact area. In other words, the second contact area is less than the first contact area.

In the IGBT 400 according to the fourth embodiment, in a case where the area of the region where the semiconductor layer 10 and the emitter electrode 12 are in contact with each other between the main gate trench 31b and the dummy gate trench 33d is defined as a third contact area, and the area of the region where the semiconductor layer 10 and the emitter electrode 12 are in contact with each other between control gate trench 32a and the dummy gate trench 33d is defined as a second contact area, the third contact area is larger than the second contact area. In other words, the second contact area is less than the third contact area.

In the IGBT 400, the area of the emitter electrode 12 that is in contact with the semiconductor layer 10 in the region between the control gate trench 32a and the dummy gate trench 33d is smaller than the area of the emitter electrode 12 that is in contact with the semiconductor layer 10 in the region between the main gate trench 31a and the control gate trench 32a. In addition, in the IGBT 400, the area of the emitter electrode 12 that is in contact with the semiconductor layer 10 in the region between the control gate trench 32a and the dummy gate trench 33d is smaller than the area of the emitter electrode 12 that is in contact with the semiconductor layer 10 in the region between the main gate trench 31b and the dummy gate trench 33d. Therefore, in the region between the control gate trench 32a and the dummy gate trench 33d, the discharge of the holes from the drift region 40 to the emitter electrode 12 is suppressed at the time of the ON state. Therefore, the on-resistance of the IGBT 400 is reduced.

From the viewpoint of reducing the on-resistance, it is preferable that the first contact area is 10 times or more the second contact area. From the viewpoint of reducing the on-resistance, it is preferable that the third contact area is 10 times or more the second contact area.

From the viewpoint of reducing the on-resistance, it is preferable that the semiconductor layer 10 and the emitter electrode 12 are not in contact with each other in the region between the control gate trench 32a and the dummy gate trench 33d. That is, it is preferable that the second contact area is zero.

In addition, in the IGBT 400, by providing the barrier region 42, the discharge of the holes in the drift region 40 to the emitter electrode 12 is restricted at the time of the ON state. Therefore, the on-resistance of the IGBT 400 is reduced. Furthermore, in the IGBT 400, when the first voltage (V1) which is a positive voltage is applied to the second gate electrode pad 102 at the time of the ON state, the n-type storage layer is formed in the barrier region 42 in contact with the control gate insulating film 17. By forming the n-type storage layer, the discharge of the holes to the emitter electrode 12 through the barrier region 42 is further restricted. Therefore, the on-resistance of the IGBT 400 is further reduced.

As described above, the on-resistance is reduced in the IGBT 400. However, since the carrier concentration of the drift region 40 in the ON state of the IGBT 400 is increased, the discharge of the holes from the drift region 40 is delayed when the IGBT 400 is set to be in the OFF state, so that there is a concern that the turn-off time is long.

The IGBT 400 according to the fourth embodiment includes the main gate electrode 21 in the main gate trench 31 and the control gate electrode 22 in the control gate trench 32. The first gate voltage (Vg1) applied to the main gate electrode 21 and the second gate voltage (Vg2) applied to the control gate electrode 22 are independently controlled.

The IGBT 400 sets the second gate voltage (Vg2) to a negative voltage before changing the first gate voltage (Vg1) from the turn-on voltage (Von) to the turn-off voltage (Voff). By setting the second gate voltage (Vg2) to a negative voltage, the p-type inversion layer is formed to face the control gate electrode 22 in the drift region 40 being in contact with the control gate insulating film 17 and the barrier region 42 being in contact with the control gate insulating film 17.

By setting the second gate voltage (Vg2) to a negative voltage, the p-type inversion layer can also be formed in the barrier region 42 having an n-type impurity concentration higher than that of the drift region 40.

The holes in the drift region 40 are discharged to the emitter electrode 12 through the p-type inversion layer. Therefore, the amount of carriers stored on the side of the first plane P1 of the drift region 40 is decreased.

When the first gate voltage (Vg1) is intended to be changed from the turn-on voltage (Von) to the turn-off voltage (Voff), since the amount of carriers stored on the side of the first plane P1 of the drift region 40 has already been small, the turn-off time is shortened. Therefore, it is possible to reduce the switching loss of the IGBT 400.

In the IGBT 400 according to the fourth embodiment, by forming the p-type inversion layer in the barrier region 42 at the time of turn-off, the discharge of the holes from the drift region 40 is facilitated, and the turn-off time can be shortened. Therefore, it is possible to reduce the switching loss.

In addition, the first voltage (V1) may be set to, for example, 0 V.

In the IGBT 400, at the time of turn-off, a negative voltage is applied to the control gate electrode 22 to form the p-type inversion layer in the vicinity of the control gate trench 32, so that a hole discharge path is formed. For this reason, the electric field strength in the vicinity of the control gate trench 32 becomes high, and the dynamic avalanche phenomenon occurs, so that there is a concern that the destruction and the long-term characteristic variation of the IGBT 400 occur. The long-term characteristic variation is, for example, a variation in switching characteristic caused by long-term use of the IGBT 400.

In the IGBT 400, the main gate trench 31 is provided adjacent to the control gate trench 32. In the IGBT 400, the main gate electrode 21 is provided adjacent to the control gate electrode 22.

The transistor having the main gate electrode 21 injects electrons from the emitter electrode 12 into the drift region 40. For this reason, in the IGBT 400, an electron injection path exists adjacent to the hole discharge path. Therefore, the electric field strength in the vicinity of the control gate trench 32 becomes low. Therefore, the destruction of the IGBT 400 and the long-term characteristic variation caused by the dynamic avalanche phenomenon are suppressed.

In addition, in the IGBT 400, the dummy gate trench 33a is provided between the control gate trench 32a and the dummy gate trench 33d. By further providing the dummy gate trench 33a between the control gate trench 32a and the dummy gate trench 33d, the trench can be provided in the semiconductor layer 10 at a constant interval. Therefore, it is possible to stably form the trench pattern.

In addition, by providing the dummy gate trench 33a, the electric field strength in the region between the control gate trench 32a and the control gate trench 32b in the OFF state of the IGBT 400 is relaxed, and the breakdown voltage of the IGBT 400 is improved.

As described above, according to the IGBT of the fourth embodiment, it is possible to reduce the on-resistance and to reduce the switching loss. In addition, according to the IGBT of the fourth embodiment, the destruction caused by the avalanche breakdown is suppressed.

In the first to fourth embodiments, a case where the semiconductor layer is single crystal silicon has been described as an example, but the semiconductor layer is not limited to the single crystal silicon. For example, other single crystal semiconductors such as a single crystal silicon carbide may be used.

In the first to fourth embodiments, a case where the first conductivity type is p-type and the second conductivity type is n-type has been described as an example, but the first conductivity type may also be n-type, and the second conductivity type may also be p-type. In a case where the first conductivity type is n-type and the second conductivity type is p-type, for example, the second voltage (V2) is a positive voltage.

In the first and second embodiments, a case where one dummy gate trench 33 is interposed between the two control gate trenches 32 has been described as an example, but the number of dummy gate trenches 33 may be two or more.

While certain embodiments have been described, these embodiments have been presented by way of example only, and are not intended to limit the scope of the inventions. Indeed, semiconductor devices and semiconductor circuits described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor layer including a first plane and a second plane facing the first plane, the semiconductor layer including:
   a first trench provided on a side of the first plane and extending in a first direction parallel to the first plane;
   a second trench provided on the side of the first plane and extending in the first direction;
   a third trench provided between the first trench and the second trench on the side of the first plane, being adjacent to the first trench, and extending in the first direction;
   a fourth trench provided between the third trench and the second trench on the side of the first plane, being adjacent to the second trench, and extending in the first direction;
   a first semiconductor region of a first conductivity type;
   a second semiconductor region of a second conductivity type provided between the first semiconductor region and the first plane;
   a third semiconductor region of the first conductivity type provided between the second semiconductor region and the first plane;
   a fourth semiconductor region of the second conductivity type provided between the third semiconductor region and the first plane, being in contact with the first trench, being separated from the third trench, and having a second conductivity type impurity concentration higher than a second conductivity type impurity concentration of the second semiconductor region; and
   a fifth semiconductor region of the second conductivity type provided between the third semiconductor region and the first plane, being in contact with the second trench, being separated from the fourth trench, and having a second conductivity type impurity concentration higher than a second conductivity type impurity concentration of the second semiconductor region;
   a first gate electrode provided in the first trench;
   a second gate electrode provided in the second trench;
   a third gate electrode provided in the third trench;
   a fourth gate electrode provided in the fourth trench;
   a first electrode provided on the side of the first plane of the semiconductor layer and being electrically connected to the fourth semiconductor region and the fifth semiconductor region, a first contact area being an area of a region where the first electrode directly contacting with the semiconductor layer between the first trench and the third trench, a second contact area being an area of a region where the first electrode directly contacting with the semiconductor layer between the third trench and the fourth trench, a third contact area being an area of a region where the first electrode directly contacting with the semiconductor layer between the second trench and the fourth trench, the first contact area being larger than the second contact area, and the third contact area being larger than the second contact area;
   a second electrode provided on a side of the second plane of the semiconductor layer and being electrically connected to the first semiconductor region;
   a first gate electrode pad provided on the side of the first plane of the semiconductor layer, being electrically connected to the first gate electrode and the second gate electrode, and being applied with a first gate voltage; and
   a second gate electrode pad provided on the side of the first plane of the semiconductor layer, being electrically connected to the third gate electrode and the fourth gate electrode, and being applied with a second gate voltage.

2. The semiconductor device according to claim 1, wherein the semiconductor layer further includes:
   a fifth trench provided between the third trench and the fourth trench on the side of the first plane and extending in the first direction; and
   a fifth gate electrode provided in the fifth trench.

3. The semiconductor device according to claim 2, wherein the fifth gate electrode is electrically connected to the first electrode.

4. The semiconductor device according to claim 1, wherein the semiconductor layer further includes:
   a sixth trench provided on a side of the first plane, the first trench being located between the third trench and the sixth trench, the sixth trench extending in the first direction;
   a sixth gate electrode provided in the sixth trench and being electrically connected to the second gate electrode pad; and
   a sixth semiconductor region of the second conductivity type provided between the third semiconductor region and the first plane, being in contact with the first trench, being separated from the sixth trench, being provided between the first trench and the sixth trench, and including a second conductivity type impurity concentration higher than a second conductivity type impurity concentration of the second semiconductor region, and
   wherein the fourth semiconductor region is provided between the first trench and the third trench.

5. The semiconductor device according to claim 1, wherein the semiconductor layer further includes:
a seventh trench provided on the side of the first plane, the first trench being located between the third trench and the seventh trench, the seventh trench extending in the first direction; and
a seventh gate electrode provided in the seventh trench and being electrically connected to the first gate electrode pad, and
wherein the fourth semiconductor region is provided between the first trench and the seventh trench.

6. The semiconductor device according to claim 1, wherein the semiconductor layer further includes a seventh semiconductor region of the first conductivity type provided between the third semiconductor region and the first plane, being in contact with the third trench, and having a first conductivity type impurity concentration higher than a first conductivity type impurity concentration of the third semiconductor region.

7. The semiconductor device according to claim 1, wherein the semiconductor layer further includes an eighth semiconductor region of the first conductivity type provided between the third semiconductor region and the first plane, being provided between the third trench and the fourth trench, and having a first conductivity type impurity concentration higher than a first conductivity type impurity concentration of the third semiconductor region.

8. The semiconductor device according to claim 1, wherein the second gate voltage is changed from a first voltage to a second voltage before the first gate voltage is changed from a turn-on voltage to a turn-off voltage, and the second voltage is a negative voltage in a case where the first conductivity type is p-type, and the second voltage is a positive voltage in a case where the first conductivity type is n-type.

9. A semiconductor circuit comprising:
the semiconductor device according to claim 1; and
a control circuit driving the semiconductor device and changing the second gate voltage from a first voltage to a second voltage before changing the first gate voltage from a turn-on voltage to a turn-off voltage, wherein the second voltage is a negative voltage in a case where the first conductivity type is p-type, and the second voltage is a positive voltage in a case where the first conductivity type is n-type.

10. A semiconductor device comprising:
a semiconductor layer including a first plane and a second plane facing the first plane, the semiconductor layer including:
a first trench provided on a side of the first plane and extending in a first direction parallel to the first plane;
a second trench provided on the side of the first plane and extending in the first direction;
a third trench provided between the first trench and the second trench on the side of the first plane, being adjacent to the first trench, and extending in the first direction;
a fourth trench provided between the third trench and the second trench on the side of the first plane, being adjacent to the second trench, and extending in the first direction;
a first semiconductor region of a first conductivity type;
a second semiconductor region of a second conductivity type provided between the first semiconductor region and the first plane;
a third semiconductor region of the first conductivity type provided between the second semiconductor region and the first plane;
a fourth semiconductor region of the second conductivity type provided between the third semiconductor region and the first plane, being in contact with the first trench, being separated from the third trench, and having a second conductivity type impurity concentration higher than a second conductivity type impurity concentration of the second semiconductor region; and
a fifth semiconductor region of the second conductivity type provided between the third semiconductor region and the first plane, being in contact with the second trench, being separated from the fourth trench, and having a second conductivity type impurity concentration higher than a second conductivity type impurity concentration of the second semiconductor region;
a first gate electrode provided in the first trench;
a second gate electrode provided in the second trench;
a third gate electrode provided in the third trench;
a fourth gate electrode provided in the fourth trench;
a first electrode provided on the side of the first plane of the semiconductor layer and being electrically connected to the fourth semiconductor region and the fifth semiconductor region, a first contact area being an area of a region where the first electrode directly contacting with the semiconductor layer between the first trench and the third trench, a second contact area being an area of a region where the first electrode directly contacting with the semiconductor layer between the third trench and the fourth trench, a third contact area being an area of a region where the first electrode directly contacting with the semiconductor layer between the second trench and the fourth trench, the first contact area being larger than the second contact area, and the third contact area being larger than the second contact area;
a second electrode provided on a side of the second plane of the semiconductor layer and being electrically connected to the first semiconductor region;
a first gate electrode pad provided on the side of the first plane of the semiconductor layer, being electrically connected to the first gate electrode and the second gate electrode, and being applied with a first gate voltage; and
a second gate electrode pad provided on the side of the first plane of the semiconductor layer, being electrically connected to the third gate electrode, and being applied with a second gate voltage,
wherein the fourth gate electrode is electrically connected to the first electrode.

11. The semiconductor device according to claim 10, wherein the semiconductor layer further includes:
a fifth trench provided between the third trench and the fourth trench on the side of the first plane and extending in the first direction; and
a fifth gate electrode provided in the fifth trench and electrically connected to the first electrode.

12. The semiconductor device according to claim 10, wherein the semiconductor layer further includes a seventh semiconductor region of the first conductivity type provided between the third semiconductor region and the first plane, being in contact with the third trench, and including a first conductivity type impurity concentration higher than a first conductivity type impurity concentration of the third semiconductor region.

13. The semiconductor device according to claim 10, wherein the semiconductor layer further includes an eighth semiconductor region of the first conductivity type provided between the third semiconductor region and the first plane, being provided between the third trench and the fourth trench, and including a first conductivity type impurity concentration higher than a first conductivity type impurity concentration of the third semiconductor region.

14. The semiconductor device according to claim 10, wherein the second gate voltage is changed from a first voltage to a second voltage before the first gate voltage is changed from a turn-on voltage to a turn-off voltage, and the second voltage is a negative voltage in a case where the first conductivity type is p-type, and the second voltage is a positive voltage in a case where the first conductivity type is n-type.

15. A semiconductor circuit comprising:
the semiconductor device according to claim 10; and
a control circuit driving the semiconductor device and changing the second gate voltage from a first voltage to a second voltage before changing the first gate voltage from a turn-on voltage to a turn-off voltage, wherein the second voltage is a negative voltage in a case where the first conductivity type is p-type, and the second voltage is a positive voltage in a case where the first conductivity type is n-type.

* * * * *